(12) United States Patent
Hsu et al.

(10) Patent No.: US 8,194,435 B2
(45) Date of Patent: Jun. 5, 2012

(54) MEMORY DEVICE

(75) Inventors: Yen-Wei Hsu, Taipei (TW); Whei-Chyou Wu, Fremont, CA (US)

(73) Assignees: Yen-Wei Hsu, Taipei (TW); Whei Chyou Wu, Fremont, CA (US)

( * ) Notice: Subject to any disclaimer, the term of this patent is extended or adjusted under 35 U.S.C. 154(b) by 291 days.

(21) Appl. No.: 12/633,797

(22) Filed: Dec. 9, 2009

(65) Prior Publication Data
US 2011/0134579 A1    Jun. 9, 2011

(51) Int. Cl.
*G11C 11/24* (2006.01)

(52) U.S. Cl. .......................... 365/149; 365/159; 365/222

(58) Field of Classification Search .................. 365/177, 365/204, 159
See application file for complete search history.

(56) References Cited

U.S. PATENT DOCUMENTS

| | | | | |
|---|---|---|---|---|
| 5,953,249 A | * | 9/1999 | van der Wagt | 365/175 |
| 6,765,822 B2 | * | 7/2004 | Uemura | 365/159 |

* cited by examiner

*Primary Examiner* — Tan T. Nguyen

(57) ABSTRACT

This invention relates to a high-speed volatile and non-volatile memory assemblies. And, an inventive FET and capacitor are also revealed and introduced into the memory assembly to enhance its performance. Further, the memory assembly has physical addressing capability with CPU so that operating system stored in the memory assembly can be quickly booted.

9 Claims, 17 Drawing Sheets

Linear operating region (ohmic mode)

MOSFET

MEMORY DEVICE

FIELD OF INVENTION

This invention relates to a high-speed volatile and non-volatile memory assemblies. And, an inventive PNDR FET, PPNDR FET, PNDR capacitor and PPNDR capacitor are also revealed and introduced into the memory assembly to enhance it performance. Further, the memory assembly has physical addressing capability with CPU so that operating system stored in the memory assembly can be quickly booted.

BACKGROUND MATERIALS

Introduction

Referring to [4], [33], [41, Vol. 1 Chapter 50] and [23, Page 402], the nonlinear system response produces many un-modeled effects: jump or singularity, bifurcation, rectification, harmonic and subharmonic generations, frequency-amplitude relationship, phase-amplitude relationship, frequency entrainment, nonlinear oscillation, stability, modulations (amplitude, frequency, phase) and chaoes. In the nonlinear analysis fields, it needs to develop the mathematical tools for obtaining the resolution of nonlinearity. Up to now, there exists three fundamental problems which are self-adjoint operator, spectral (harmonic) analysis, and scattering problems, referred to [31, Chapter 4.], [37, Page 303], [34, Chapter X], [36, Chapter XI], [35, Chapter XIII], [24] and [33, Chapter 7.].

There are many articles involved the topics of the nonlinear spectral analysis and reviewed as the following sections. The first one is the nonlinear dynamics and self-excited or self-oscillation systems. It provides a profound viewpoint of the non-linear dynamical system behaviors, which are duality of second-order systems, self-excitation, orbital equivalence or structural stability, bifurcation, perturbation, harmonic balance, transient behaviors, frequency-amplitude and phase-amplitude relationships, jump phenomenon or singularity occurrence, frequency entrainment or synchronization, and so on. In particular, the self-induced current (voltage) or electricity generation appears if applying to the Liénard system.

Dielectric Materials

Referring to [30, Chapter 4, 5, 8, 9], [19, Part One], [20, Chapter 1], [7, Chapter 14], the response of a material to an electric field can be used to advantage even when no charge is transferred. These effects are described by the dielectric properties of the material. Dielectric materials pons a large energy gap between the valence and conduction bands, thus the materials a high electrical resistivity. Because dielectric materials are used in the AC circuits, the dipoles must be able to switch directions, often in the high frequencies, where the dipoles are atoms or groups of atoms that have an unbalanced charge. Alignment of dipoles causes polarization which determines the behavior of the dielectric material. Electronic and ionic polarization occur easily even at the high frequencies. Some energy is lost as heat when a dielectric material polarized in the AC electric field. The fraction of the energy lost during each reversal is the dielectric loss. The energy losses are due to current leakage and dipoles friction (or change the direction). Losses due to the current leakage are low if the electrical resistivity is high, typically which behaves $10^{11}$ Ohm·m or more. Dipole friction occurs when reorientation of the dipoles is difficult, as in complex organic molecules. The greatest loss occurs at frequencies where the dipoles almost, but not quite, can be reoriented. At lower frequencies, losses are low because the dipoles have time to move. At higher frequencies, losses are low because the dipoles do not move at all.

For a capacitor made from dielectric ceramics, referred to [19, Part One], [20, Chapter 1], [30, Page 253-255], its capacitance C, which is equivalent to one ideal capacitor $C_i$ and series resistance $R_s$ in the FIG. 5, is function of frequency ω, equivalent series resistance $R_s$ and loss tangent of dielectric materials tan (δ) as $$C = \frac{\tan(\delta)}{R_s \omega} \tag{1}$$

respectively. That is, if changing the $R_s$, tan (δ) for different materials or ω, the C becomes a variable capacitance.

Cauchy-Riemann Theorem

Referring to the [42], [11], [40] and [3], the complex variable analysis is a fundamental mathematical tool for the electrical circuit theory. In general, the impedance function consists of the real and imaginary parts. For each part of impedance functions, they are satisfied the Cauchy-Riemann Theorem. Let a complex function be $$z(x,y)=F(x,y)+iG(x,y) \tag{2}$$

where F(x,y) and G(x,y) are analytic functions in a domain D and the Cauchy-Riemann theorem is the first-order derivative of functions F(x,y) and G(x,y) with respect to x and y becomes $$\frac{\partial F}{\partial x} = \frac{\partial G}{\partial y} \tag{3}$$

and $$\frac{\partial F}{\partial y} = -\frac{\partial G}{\partial x} \tag{4}$$

Furthermore, taking the second-order derivative with respect to x and y, we can obtain two $2^{nd}$-order partial differential equations as $$\frac{\partial^2 F}{\partial x^2} + \frac{\partial^2 F}{\partial y^2} = 0 \tag{5}$$

and $$\frac{\partial^2 G}{\partial x^2} + \frac{\partial^2 G}{\partial y^2} = 0 \tag{6}$$

respectively, also F(x,y) and G(x,y) are called the harmonic functions.

From the equation (2), the total derivative of the complex function z(x,y) is $$dz(x, y) = \left(\frac{\partial F}{\partial x}dx + \frac{\partial F}{\partial y}dy\right) + i\left(\frac{\partial G}{\partial x}dx + \frac{\partial G}{\partial y}dy\right) \tag{7}$$

and substituting equations (3) and (4) into the form of (7), then the total derivative of the complex function (2) is dependent on the real function F(x,y) or in terms of the real-valued function F(x,y) (real part) only, $$dz(x, y) = \left(\frac{\partial F}{\partial x}dx + \frac{\partial F}{\partial y}dy\right) + i\left(\frac{\partial F}{\partial x}dy - \frac{\partial F}{\partial y}dx\right) \tag{8}$$

and in terms of a real-valued function G(x,y) (imaginary part) only, $$dz(x, y) = \left(\frac{\partial G}{\partial y}dx - \frac{\partial G}{\partial x}dy\right) + i\left(\frac{\partial G}{\partial x}dx + \frac{\partial G}{\partial y}dy\right) \quad (9)$$

There are the more crucial facts behind the (8) and (9) potentially. As a result, the total derivative of the complex function (7) depends on the real (imaginary) part of (2) function F(x,y) or G(x,y) only and never be a constant value function. One said, if changing the function of real part, the imaginary part function is also varied and determined by the real part via the equations (3) and (4). Since the functions F(x,y) and G(x,y) have to satisfy the equations (5) and (6), they are harmonic functions and then produce the frequency related elements discussed at the analytic continuation section. Moreover, the functions of real and imaginary parts are not entirely independent, referred to the Hilbert transforms in the textbooks [17, Page 296] and [19, Page 5 and Appendix One].

Analytic Continuation

The impedance of the circuit has been discussed in this section. According to the equation (11) has shown that a PDR and NDR coupled in series in a circuit can induce significant, enlarged harmonic, sub-harmonic, super-harmonic and intermediate harmonic components which will modulate all together to present multi-band waveforms with broad bandwidth.

For each analytic function F(z) in the domain D, the Laurent series expansion of F(z) is defined as the following $$F(z) = \sum_{n=-\infty}^{\infty} a_n(z-z_0)^n \quad (10)$$
$$= \ldots + a_{-2}(z-z_0)^{-2} + a_{-1}(z-z_0)^{-1} + a_0 + \ldots$$

where the expansion center $z_0$ is arbitrarily selected. Since this domain D for this analytic function F(z), any regular point imparts a center of a Laurent series [42, Page 223], i.e., $$F(z) = \sum_{-\infty}^{\infty} c_n(z-z_j)^n$$

where $z_j$ is an arbitrary regular point in this complex analytic domain D for j=0, 1, 2, 3, . . . . For each index j, the complex variable is the product of its norm and phase, $$z - z_j = |z - z_j|e^{i\theta_j} \quad (11)$$

and $$F(z) = \sum_{-\infty}^{\infty} c_n|z-z_j|^n e^{in\omega_j t}$$

As long as a loop is formed the impedance function can be written in the form as the equation above. For each phase angle $\theta_j$, the corresponding frequency elements are naturally produced, say harmonic frequency $\omega_j$. For different $z_j$ correspond to the impedances with different values, frequencies and phases. Now we have the following results:
1. As the current passing through any smoothing conductor (without singularities), the frequencies are induced in nature.
2. This conductor imparts an order-∞ resonant coupler.
3. This conductor is to be as an antenna without any bandwidth limitation.
4. Dynamic impedance matched.

Positive and Negative Differential Resistances (PDR, NDR)

More inventively, due to observing the positive and negative differential resistors properties qualitatively, we introduce the Cauchy-Riemann equations, [26, Part 1, 2], [42], [11], [40] and [3], for describing a system impedance transient behaviors and particularly in some sophisticated characteristics system parameterization by one dedicated parameter ω. Consider the impedance z in specific variables (i,v) complex form of $$z = F(i,v) + jG(i,v) \quad (12)$$

where i, v are current and voltage respectively. Assumed that the functions F(i,v) and G(i,v) are analytic in the specific domain. From the Cauchy-Riemann equations (3) and (4) becomes as following $$\frac{\partial F}{\partial i} = \frac{\partial G}{\partial v} \quad (13)$$

and $$\frac{\partial F}{\partial v} = -\frac{\partial G}{\partial i} \quad (14)$$

where in these two functions there exists one relationship based on the Hilbert transforms [17, Page 296] and [19, Page 5]. In other words, the functions F(i,v) and G(i,v) do not be obtained individually. Using the chain rule, equations (13) and (14) are further obtained $$\frac{\partial F}{\partial \omega}\frac{d\omega}{di} = \frac{\partial G}{\partial \omega}\frac{d\omega}{dv} \quad (15)$$

and $$\frac{\partial F}{\partial \omega}\frac{d\omega}{dv} = -\frac{\partial G}{\partial \omega}\frac{d\omega}{di} \quad (16)$$

where the parameter ω could be the temperature field T, magnetic field flux intensity B, optical field intensity I, in the electric field for examples, voltage v, current i, frequency ω or electrical power P, in the mechanical field for instance, magnitude of force F, and so on. Let the terms $$\begin{cases} \dfrac{d\omega}{dv} > 0 \\ \dfrac{d\omega}{di} > 0 \end{cases} \quad (17)$$

or $$\begin{cases} \dfrac{d\omega}{dv} < 0 \\ \dfrac{d\omega}{di} < 0 \end{cases} \quad (18)$$

be non-zero and the same sign. Under the same sign conditions as equation (17) or (18), from equation (15) to equation (16), $$\frac{\partial F}{\partial \omega} > 0 \quad (19)$$

$$\frac{\partial F}{\partial \omega} < 0 \quad (20)$$

and $$\frac{\partial F}{\partial \omega} = 0 \quad (21)$$

should be held simultaneously, where (21) means a constant resistor. From the viewpoint of making a power source, the simple way to perform equations (17) and (18) is to use the pulse-width modulation (PWM) method.

The further meaning of (17) and (18) is that using the variable frequency ω in pulse-width modulation to current and voltage is the most straightforward way, i.e., $$\begin{cases} \frac{\partial \omega}{\partial v} \neq 0 \\ \frac{\partial \omega}{\partial i} \neq 0 \end{cases} \quad (22)$$

In nature, ∂F/∂ω and ∂G/∂ω are positive or in general, under the condition like as the (23)

$$\frac{\partial F}{\partial \omega} \frac{\partial G}{\partial \omega} > 0 \quad (23)$$

in equation (17) or (18), we can obtain the result of $$\frac{\partial \omega}{\partial v} \frac{\partial \omega}{\partial i} < 0 \quad (24)$$

In the report [39], we can find a negative slope in the I-V curve of some special fiber-carbon materials $$\frac{dV}{dI} = -R$$

or in parameter form $$\frac{\frac{dV}{d\omega}}{\frac{dI}{d\omega}} = -R$$

where the resistance R is a positive value, $$R > 0$$

or $$\frac{dV}{d\omega} \frac{dI}{d\omega} < 0$$

also its equivalent form $$\frac{d\omega}{dV} \frac{d\omega}{dI} < 0$$

The negative sign contributed from the current or voltage has a backward direction with respect to input current I or voltage V. In particular, this reverse current (−I) is to be called "backflow." After obtaining the qualitative behaviors of equation (19) and equation (20), also we need to further respectively define the quantitative behaviors of equation (19) and equation (20). Intuitively, any complete system described by the equation (12) could be analogy to the simple-parallel oscillator as FIG. 1 or simple-series oscillator as FIG. 2 which corresponds to $2^{nd}$-order differential equation respectively either as (27) or (32). Referring to [41, Vol 2, Chapter 8, 9, 10, 11, 22, 23], [16, Page 173], [5, Page 181], [21, Chapter 10] and [13, Page 951-968], as the FIG. 1, let the current $i_l$ and voltage $v_C$ be replaced by x, y respectively. From the Kirchhoff's Law, this simple oscillator is expressed as the form of $$L\frac{dx}{dt} = y \quad (25)$$

$$C\frac{dy}{dt} = -x + F_p(y) \quad (26)$$

or in matrix form $$\begin{bmatrix} \frac{dx}{dt} \\ \frac{dy}{dt} \end{bmatrix} = \begin{bmatrix} 0 & \frac{1}{L} \\ -\frac{1}{C} & 0 \end{bmatrix} \begin{bmatrix} x \\ y \end{bmatrix} + \begin{bmatrix} 0 \\ \frac{F_p(y)}{C} \end{bmatrix} \quad (27)$$

where the function $F_p(y)$ represents the generalized Ohm's law and for the single variable case, $F_P(x)$ is the real part function of the impedance function equation (12), the "p" in short, is a "parallel" oscillator. Furthermore, equation (27) is a Liénard system. The quality factor $Q_p$ is defined as $$Q_p \equiv \frac{1}{2\xi_p} \quad (28)$$

$$= \frac{\omega_{pn} f_p(y)}{L}$$

where $\xi_p$ is the damping ration of (27), $$\omega_{pn} = \frac{1}{\sqrt{LC}} \quad (29)$$

is the natural frequency of (27) and $$f_p(y) \equiv \frac{dF_p(y)}{dy} \bigg|_y$$

respectively. If taking the linear from of $F_p(y)$, $$F_p(y) = Ky$$

and K>0, it is a normally linear Ohm's law. Also, the states equation of a simple series oscillator in the FIG. 2 is $$L\frac{dx}{dt} = y - F_s(x) \quad (30)$$

$$C\frac{dy}{dt} = -x \quad (31)$$

in the matrix form, $$\begin{bmatrix} \frac{dx}{dt} \\ \frac{dy}{dt} \end{bmatrix} = \begin{bmatrix} 0 & \frac{1}{L} \\ -\frac{1}{C} & 0 \end{bmatrix} \begin{bmatrix} x \\ y \end{bmatrix} + \begin{bmatrix} -\frac{F_s(x)}{L} \\ 0 \end{bmatrix} \quad (32)$$

The $i_C$, $v_l$ have to be replaced by x, y respectively. The function $F_s(x)$ indicates the generalized Ohm's law and (32) is the Liénard system too. The corresponding $Q_s$ value is $$Q_s = \frac{\omega_{sn} L}{f_s(x)} \quad (33)$$

where $$\omega_{sn} = \frac{1}{\sqrt{LC}} \quad (34)$$

is the natural frequency of (32) and $$f_s(x) \equiv \frac{dF_s(x)}{dx}\bigg|_x$$

respectively. Again, considering one system as the FIG. 2, let L, C be to one, then the system (32) becomes the form of $$\begin{bmatrix} \frac{dx}{dt} \\ \frac{dy}{dt} \end{bmatrix} = \begin{bmatrix} y - F_s(x) \\ -x \end{bmatrix} \quad (35)$$

To obtain the equilibrium point of the system (32), setting the right hand side of the system (35) is zero $$\begin{cases} y - F_s(0) = 0 \\ -x = 0 \end{cases}$$

where $F_s(0)$ is a value of the generalized Ohm's law at zero. The gradient of (35) is $$\begin{bmatrix} -F'_s(0) & 1 \\ -1 & 0 \end{bmatrix}$$

Let the slope of the generalized Ohm's law $F'_s(0)$ be a new function as $f_s(0)$ $$f_s(0) = F'_s(0)$$

the correspondent eigenvalues $\lambda_{1,2}^s$ are as $$\lambda_{1,2}^s = \frac{1}{2}\left[-f_s(0) \pm \sqrt{(f_s(0))^2 - 4}\right]$$

Similarly, in the simple parallel oscillator (27), $$f_p(0) = F'_p(0)$$

the equilibrium point of (27) is set to $(F_p(0), 0)$ and the gradient of (27) is $$\begin{bmatrix} 0 & 1 \\ -1 & f_p(0) \end{bmatrix}$$

the correspondent eigenvalues $\lambda_{1,2}^p$ are $$\lambda_{1,2}^p = \frac{1}{2}\left(f_p \pm \sqrt{(f_p(0))^2 - 4}\right)$$

The qualitative properties of the systems (27) and (32), referred to [13] and [21], are as the following:
1. $f_s(0) > 0$, or $f_p(0) < 0$, its correspondent equilibrium point is a sink.
2. $f_s(0) < 0$, or $f_p(0) > 0$, its correspondent equilibrium point is a source.

Thus, observing previous sink and source quite different definitions, if the slope value of impedance function $F_s(x)$ or $F_p(y)$, $f_s(x)$ or $f_p(y)$ is a positive value $$F'_s(x) = f_s(x) > 0 \quad (36)$$

or $$F'_p(y) = f_p(y) > 0 \quad (37)$$

it is the name of the positive differential resistivity or PDR.
On contrary, it is a negative differential resistivity or NDR.

$$F'_s(x) = f_s(x) < 0 \quad (38)$$

or $$F'_p(y) = f_p(y) < 0 \quad (39)$$

3. if $f_s(0) = 0$, or $f_p(0) = 0$, its correspondent equilibrium point is a bifurcation point, referred to [22, Page 433], [23, Page 26] and [21, Chapter 10] or fixed point, [2, Chapter 1, 3, 5, 6], or singularity point, [6], [1, Chapter 22, 23, 24].

$$F'_s(x) = f_s(x) = 0 \quad (40)$$

or $$F'_p(y) = f_p(y) = 0 \quad (41)$$

Liénard Stabilized Systems

This section has used periodical motion to check a system's stability, and also has explained the role of PDR and NDR in a stable system.

Taking the system equation (27) or equation (32) is treated as a nonlinear dynamical system analysis, we can extend these systems to be a classical result on the uniqueness of the limit cycle, referred to [1, Chapter 22, 23, 24], [23, Page 402-407], [32, Page 253-260], [21, Chapter 10, 11]

and many articles [25], [18], [29], [27], [28], [15], [10], [38], [9], [14], [8], [12] for a dynamical system as the form of $$\begin{cases} \frac{dx}{dt} = y - F(x) \\ \frac{dy}{dt} = -g(x) \end{cases} \quad (42)$$

under certain conditions on the functions F and g or its equivalent form of the nonlinear dynamics $$\frac{d^2x}{dt^2} + f(x)\frac{dx}{dt} + g(x) = 0 \quad (43)$$

where the damping function $f(x)$ is the first derivative of impedance function $F(x)$ with respect to the state x $$f(x) = F'(x) \quad (44)$$

Based on the spectral decomposition theorem [22, Chapter 7], the damping function has to be a non-zero value if it is a stable system. The impedance function is a somehow specific pattern like as the FIG. 3, $$y = F(x) \quad (45)$$

From equation (42), equation (43) and equation (44), the impedance function $F(x)$ is the integral of damping function $f(x)$ over one specific operated domain x>0 as $$F(x) = \int_0^x f(s)ds \quad (46)$$

Under the assumptions that F, g∈C$^1$ (R), F and g are odd functions of x, F(0)=0, F'(0)<0, F has single positive zero at x=a, and F increases monotonically to infinity for x≧a as x→∞, it follows that the Liénard's system equation (42) has exactly one limit cycle and it is stable. Comparing the (46) to the bifurcation point defined in the section ( ), the initial condition of the (46) is extended to an arbitrary setting as $$F(x) = \int_a^x f(\zeta)d\zeta \quad (47)$$

where a∈R. Also, the FIG. 4 is modified as where the dashed lines are different initial conditions. Based on above proof and carefully observing the function (44) in the FIG. 4, we conclude the critical insights of the system (42). We conclude that an adaptive-dynamic damping function F(x) with the following properties:
1. The damping function is not a constant. At the interval, α≦a the impedance function F(x) is F(x)<0

The function derivative of F(x) should be $F'(x) = f(x) \geq 0$ (48)

which is a PDR as defined by (36) or (37) and $F'(x) = f(x) < 0$ (49)

which is a NDR as defined by (38) or (39), and both hold simultaneously. Which means that the impedance function F(x) has the negative and positive slopes at the interval α≦a.
2. Following the Liénard theorem [32, Page 253-260], [21, Chapter 10, 11], [23, Chapter 8] and the correspondent theorems, corollaries and lemma, we can further conclude that one stabilized system which has at least one limit cycle, all solutions of the system (42) converge to this limit cycle even asymptotically stable periodic closed orbit. In fact, this kind of system construction can be realized a stabilized system in Poincaré sense [32, Page 253-260], [21, Chapter 10, 11], [16, Chapter 1, 2, 3, 4], [5, Chapter 3].

Furthermore, one nonlinear dynamic system is as the following form of $$\frac{d^2x}{dt^2} + \varepsilon f(x,y)\frac{dx}{dt} + g(x) = 0 \quad (50)$$

or $$\begin{cases} \frac{dx}{dt} = y - \varepsilon F(x,y) \\ \frac{dy}{dt} = -g(x) \end{cases} \quad (51)$$

where $$f(x,y) \quad (52)$$

is a nonzero and nonlinear damping function, $$g(x) \quad (53)$$

is a nonlinear spring function, and $$F(x,y) \quad (54)$$

is a nonlinear impedance function also they are differentiable. If the following conditions are valid
1. there exists a>0 such that $f(x,y)>0$ when $\sqrt{x^2+y^2} \geq a$.
2. $f(0,0)<0$ (hence $f(x,y)<0$ in a neighborhood of the origin).
3. $g(0)=0$, $g(x)>0$ when x>0, and $g(x)<0$ when x<0.
4. $G(x)=\int_0^x g(u)du \to \infty$ as x→∞.

then (50) or (51) has at least one periodic solution.

Frequency-Shift Damping Effect

This section has used frequency shifting to re-define power generation and dissipation. This section also has revealed frequency shifting produced by a PDR and NDR coupled in series. Referring to the books [3, p 313], [34, Page 10-11], [24, Page 13] and [40, page 171-174], we assume that the function is a trigonometric Fouries series generated by a function g(t)∈L(I), where g(t) should be bounded and the unbounded case in the book [40, page 171-174] has proved, and L(I) denotes Lebesgue-integrable on the interval I, then for each real β, we have $$\lim_{\omega \to \infty} \int_I g(t)e^{i(\omega t + \beta)}dt = 0 \quad (55)$$

where $$e^{i(\omega t + \beta)} = \cos(\omega t + \beta) + i\sin(\omega t + \beta)$$

the imaginary part of (55)

$$\lim_{\omega \to \infty} \int_I g(t)\sin(\omega t + \beta)dt = 0 \quad (56)$$

and real part of (55)

$$\lim_{\omega \to \infty} \int_I g(t)\cos(\omega t + \beta)dt = 0 \quad (57)$$

are approached to zero as taking the limit operation to infinity, $\omega \to \infty$, where equation (56) or (57) is called "Riemann-Lebesgue lemma" and the parameter $\omega$ is a positive real number. If g(t) is a bounded constant and $\omega>0$, it is naturally the (56) can be further derived into $$\left| \int_a^b e^{i(\omega t + \beta)} dt \right| = \left| \frac{e^{ia\omega} - e^{ib\omega}}{\omega} \right| \leq \frac{2}{\omega}$$

where [a, b]∈I is the boundary condition and the result also holds if on the open interval (a,b). For an arbitrary positive real number ∈>0, there exists a unit step function s(t), referred to [3, p 264], such that $$\int_I |g(t) - s(t)| dt < \frac{\varepsilon}{2}$$

Now there is a positive real number M such that if $\omega \geq M$, $$\left| \int_I s(t)e^{i(\omega t + \beta)} dt \right| < \frac{\varepsilon}{2} \quad (58)$$

holds. Therefore, we have $$\left| \int_I g(t)e^{i(\omega t + \beta)} dt \right| \leq \left| \int_I (g(t) - s(t))e^{i(\omega t + \beta)} dt \right| + \left| \int_I s(t)e^{i(\omega t + \beta)} dt \right| \quad (59)$$

$$\leq \int_I |g(t) - s(t)| dt + \frac{\varepsilon}{2}$$

$$< \frac{\varepsilon}{2} + \frac{\varepsilon}{2}$$

$$= \varepsilon$$

i.e., (56) or (57) is verified and hold.

According to the Riemann-Lebesgue lemma, the equation (55) or (57) and (56), as the frequency $\omega$ approaches to $\infty$ which means $$\omega >> 0$$

then $$\lim_{\omega \to \infty} \int_I g(t)e^{i(\omega t + \beta)} dt = 0 \quad (60)$$

The equation (60) is a foundation of the energy dissipation. For removing any destructive energy component, (60) tells us the truth whatever the frequencies are produced by the harmonic and subharmonic waveforms and completely "damped" out by the ultra-high frequency modulation.

Observing (60), the function g(t) is an amplitude of power which is the amplitude-frequency dependent and seen the book [23, Chapter 3, 4, 5, 6]. It means if the higher frequency $\omega$ produced, the more g(t) is attenuated. When moving the more higher frequency, the energy of (60) is the more rapidly diminished. We conclude that a large part of the power has been dissipated to the excited frequency $\omega$ fast drifting across the board of each reasonable resonant point, rather than transferred into the thermal energy (heat). After all, applying the energy to a system periodically causes the $\omega$ to be drifted continuously from low to very high frequencies for the energy absorbing and dissipating. Again removing the energy, the frequency rapidly returns to the nominal state. It is a fast recovery feature. That is, this system can be performed and quickly returned to the initial states periodically.

As the previous described, realized that the behavior of the frequency getting high as increasing the amplitude of energy and vice versa, expressed as the form of $$\omega = \omega(g(t)) \quad (61)$$

The amplitude-frequency relationship as (61) which induces the adaptation of system. It means which magnitude of the energy produces the corresponding frequency excitation like as a complex damper function (52).

Consider one typical example, assumed that given the voltage $$v(t) = V_0 e^{j(w_v t + \alpha_v)} \quad (62)$$

and current $$i(t) = I_0 e^{j(w_i t + \alpha_i)} \quad (63)$$

the total applied power is defined as $$P = \int_0^T i(t)v(t)dt \quad (64)$$

$$= \frac{V_0 I_0}{(\omega_v + \omega_i)} \left( e^{j(\alpha_v + \alpha_i + \frac{\pi}{2})} (1 - e^{j(\omega_v + \omega_i)T}) \right) \quad (65)$$

Let the frequency $\omega$ and phase angle $\beta$ be as $$\omega = \omega_v + \omega_i$$

and $$\beta = \alpha_i + \alpha_v$$

then equation (65) becomes into the complex form of $$P = \pi(\omega, \beta, T) + jQ(\omega, \beta, T) \quad (66)$$

$$= \frac{V_0 I_0}{\omega} \left( e^{j(\beta + \frac{\pi}{2})} (1 - e^{j\omega T}) \right) \quad (67)$$

where real power $\pi(\omega, \beta, T)$ is $$\pi(\omega, \beta, T) = \frac{2V_0 I_0 \sin(\omega T)\cos(2\pi - 2\beta - \omega T)}{\omega} \quad (68)$$

and virtual power $Q(\omega,\beta,T)$ is $$Q(\omega, \beta, T) = \frac{2V_0 I_0 \sin(\omega T)\sin(2\pi - 2\beta - \omega T)}{\omega} \quad (69)$$

respectively. Observing (55), taking limit operation to (66), (65) or (67), $$\lim_{\omega \to \infty} \frac{V_0 I_0}{\omega} \left( e^{j(\beta + \frac{\pi}{2})}(1 - e^{j\omega T}) \right) = 0 \quad (70)$$

the electric power P is able to filter out completely no matter how they are real power (68) or virtual power (69) via performing frequency-shift or Doppler's shift operation, where $\omega_v$, $\omega_i$ are frequencies of the voltage v(t) and current i(t), and $\alpha_v$, $\alpha_i$ are correspondent phase angles and T is operating period respectively. Let the real power to be zero, $$2\pi - 2\beta - \omega T = \frac{\pi}{2}$$

which means that the frequency $\omega$ is shifted to $$\omega_{Vir} = \frac{1}{T}\left(\frac{3\pi}{2} - 2\beta\right)$$

The total power (66) is converted to the maximized virtual power $$\text{Max}(Q(\omega_{Vir}, \beta, T)) = \frac{2V_0 I_0 \sin(\omega_{Vir} T)}{\omega_{Vir}}$$

$$= \frac{2V_0 I_0 T\cos(2\beta)}{\left(\frac{3\pi}{2} - 2\beta\right)}$$

Similarly, $$2\pi - 2\beta - \omega T = 0$$

or $$\omega_{Re} = \frac{2}{T}(\pi - \beta)$$

the total power (66) is totally converted to the maximized real power $$\text{Max}(\pi(\omega_{Re}, \beta, T)) = \frac{2V_0 I_0 \sin(\omega_{Re} T)}{\omega_{Re}}$$

$$= \frac{V_0 I_0 T \sin(2\beta)}{(\beta - \pi)}$$

In fact, moving out the frequency element $\omega$ was the (70) is power conversion between real power (68) and virtual power (69).

Maximized Power Transfer Theorem

Consider the voltage source $V_s$ to be $$V_s = V_0$$

and its correspondent impedance $Z_s$ $$Z_s = R_s + jQ_s$$

The impedance of the system load $Z_L$ is $$Z_L = R_L + jQ_L$$

The maximized power transmission occurrence if $R_L$ and $Q_L$ are varied, not to be the constants, $$R_L = R_s \quad (71)$$

where the resistor $R_s$ is called equivalent series resistance or ESR and $$Q_L = -Q_s \quad (72)$$

Comparing (71) to (72), the impedances of voltage source and the system load should be conjugated, i.e., $$Z_L = Z_s^*$$

then the overall impedance becomes the sum of $Z_s + Z_L$, or $$Z = Z_s + Z_L = R_s + R_L + j(Q_s + Q_L) \quad (73)$$

The power of impedance consumption is $$P = I^2 R_L$$

$$= \left(\frac{[(R_s + R_L) - j(Q_s + Q_L)]}{(R_s + R_L)^2 + (Q_s + Q_L)^2}\right)^2 V_0^2 R_L$$

Let the imaginary part of P be setting to zero, $$(Q_s + Q_L) = 0 \quad (74)$$

i.e., $$Q_s = -Q_L$$

or resonance mode. In fact, it is an impedance matched motion. The power of the total impedance consumption becomes just real part only, $$P = \frac{V_0^2 R_L}{(R_s + R_L)^2}$$

From the basic algebra, $$\frac{R_s + R_L}{2} \geq \sqrt{R_s R_L}$$

where $R_s$ and $R_L$ have to be the positive values, $$R_s, R_L \geq 0 \quad (75)$$

or $$(R_s - R_L)^2 = 0$$

In other words, the resistance $R_s$ and $R_L$ are the same magnitudes as $$R_s = R_L \quad (76)$$

The power of impedance consumption P becomes an averaged power $P_{av}$ $$P_{av} = \frac{1}{2}\frac{V_0^2}{R_L} \quad (77)$$
$$= \frac{V_0^2}{(2R_L)}$$

and the total impedance becomes twice of the resistance $R_L$ or $R_s$.

$$Z = 2R_L \quad (78)$$

Let (72) be a zero, i.e., impedance matched, $$Q_s = Q_L = 0 \quad (79)$$

from (76), the total impedance and consumed power P are (78), (77) respectively. In other word, comparing the (2) to (79), it is hard to implement that the imaginary part of impedance (73) keeps zero. But applying the (3) and (4) operations into the form of (7), the results have been verified on the Cauchy-Riemann theorem, also it is a possible way to create the zero value of imaginary part of total impedance (73) or (7). Another way is producing a conjugated part of (73) or (7) dynamically and adaptively or order-∞ resonance mode.

REFERENCES

[1] Nicholas Minorsky. *Nonlinear oscillations*. Van Nostrand, New York., http://www.alibris.com, 1962.
[2] Alberto Abbondandolo. *Morse Theory for Hamiltonian Systems*. CRC Press., http://www.crcpress.com/, 2000.
[3] Tom M. Apostol. *Mathematical Analysis*. Addison-Wesley Publishing Company., http://www.aw-bc.com/, 2nd edition, 1975.
[4] V. I. Arnold. *Ordinary Differential Equations*. MIT Press., http://www.mitpress.com/, 1973.
[5] V. I. Arnold. *Geometrical Methods in the Theory of Ordinary Differential Equations*. Springer-Verlag., http://www.springer-ny.com/, 2nd edition, 1988.
[6] V. I. Arnold. *Theory of Singularities and its Applications*., volume 1. American Mathematicial Society., http://www.ams.org/, 2nd edition, 1990.
[7] Donald R. Askeland. *The Science and Engineering of Materials*. PWS Publishers., alternate edition, 1985.
[8] J. Balakrishnan. A geometric framework for phase synchronization in coupled noisy nonlinear systems. *Physical Review E*, 73:036206, 2006.
[9] Timoteo Carletti and Gabriele Villari. A note on existence and uniqueness of limit cycles for li'nard systems, 2003.
[10] V. K. Chandrasekar, M. Senthilvelan, and M. Lakshmanan. An unusual li'nard type nonlinear oscillator with properties of a linear harmonic oscillator, 2004.
[11] E. T. Copson. *An introduction to the theory of functions of a complex variable*. Oxford University Press., http://www.amazon.com/, 4th edition, 1948.
[12] M. C. Cross, A. Zumdieck, Ron Lifshitz, and J. L. Rogers. Synchronization by nonlinear frequency pulling. *Physical Review Letters*, 93:224101, 2004.
[13] R. Wong F. Cuker. *The Collected Papers of Stephen Smale*., volume 3. Singapore University Press., http://www.worldscibooks.com/mathematics, 2000.
[14] H. Giacomini and S. Neukirch. On the number of limit cycles of the lienard equation, 1997.
[15] Jaume Gine and Maite Grau. A note on "relaxation oscillators with exact limit cycles", 2005.
[16] John Guckenheimer and Philip Holmes. *Nonlinear Oscillations, Dynamical Systems, and Bifurcations of Vector Fields*. Springer-Verlag., http://www.springer-ny.com/, 1997.
[17] Ernest A. Guillemin, editor. *Synthesis of Passive Networks: Theory and Methods Appropriate to the Realization and Approximation Problems*. John Wiley and Sons., 1957.
[18] Edward H. Hellen and Matthew J. Lanctot. Nonlinear damping of the lc circuit using anti-parallel diodes, 2006.
[19] Arthur R. Von Hippel. *Dielectrics and Waves*. A John Wiley & Sun, Inc., http://www.wiley.com, 1954.
[20] Arthur Von Hippel. *Dielectric Materials and Applications*. Artech House Publishers., http://www.artechhouse.com, 1995.
[21] Morris W. Hirsh and Stephen Smale. *Differential Equations, Dynamical Systems and Linear Algebra*. Academic Press., http://www.academicpress.com/, 1974.
[22] Thomas J. R. Hughes. Jerrold E. Marsden. *Mathematical Foundations of Elasticity*. Prentice-Hall, Inc., http://www-.doverpublications.com/, 1984.
[23] D. W. Jordan and Peter Smith. *Nonlinear Ordinary Differential Equations*. Oxford University Press., http://www.oup.co.uk/academic/, 3rd edition, 1999.
[24] Yitzhak Katznelson. *An Introduction to Harmonic Analysis*. Cambridge University Press, http://www.amazon.com/, 2nd edition, 1968.
[25] Alexandra S. Landsman and Ira B. Schwartz. Predictions of ultra-harmonic oscillations in coupled arrays of limit cycle oscillators, 2006.
[26] Serge Lang. *Complex Analysis*. Springer-Verlag., http://www.springer.de/phy/books/ssp, 4th edition, 1999.
[27] Jose-Luis Lopez and Ricardo Lopez-Ruiz. The limit cycles of lienard equations in the strongly non-linear regime, 2002.
[28] Jose-Luis Lopez and Ricardo Lopez-Ruiz. Approximating the amplitude and form of limit cycles in the weakly non-linear regime of lienard systems, 2006.
[29] Jose-Luis Lopez and Ricardo Lopez-Ruiz. The limit cycles of lienard equations in the weakly nonlinear regime, 2006.
[30] A. J. Moulson and J. M. Herbert. *Electroceramics: Materials, Properties, Applications*. Wiley and Sun Ltd., http://www3.wileye.com, 2nd edition, 2003.
[31] Peter J. Olver. *Applications of Lie Groups to Differential Equations*. Springer-Verlag., http://www.springer-ny.com/, 1993.
[32] Lawrence Perko. *Differential Equations and Dynamical Systems*. Springer-Verlag, New York, Inc., http://www.springer-ny.com, 3rd edition, 2000.
[33] Jerrold E. Marsden. Ralph Abraham. *Foundations of Mechanics*. Perseus Publishing., http://www.perseusbooksgroup.com/front.html, 2nd edition, 1984.
[34] Michael Reed and Barry Simon. *Methods of Modern Mathematical Physics: Fourier Analysis, Self-Adjointness.*, volume 2. Academic Press., http://www.academicpress.com, 1975.
[35] Michael Reed and Barry Simon. *Methods of Modern Mathematical Physics: Analysis of Operators.*, volume 4. Academic Press., http://www.academicpress.com, 1978.
[36] Michael Reed and Barry Simon. *Methods of Modern Mathematical Physics: Scattering Theory.*, volume 3. Academic Press., http://www.academicpress.com, 1979.
[37] George F. Simmons. *Introduction to Topology and Modern Analysis*. McGRAW-HILL Inc., http://books.mcgrawhill.com, 1963.
[38] Ali Taghavi. On periodic solutions of lienard equations, 2004.

[39] Shoukai Wang and D. D. L. Chung. Apparent negative electrical resistance in carbon fiber composites, 1999.
[40] E. T. Whittaker and G. N. Watson. *A Course of Modern Analysis*. Cambridge Mathematical Library., http://www.cambridge.org, 4th edition, 1927.
[41] Matthew Sands. W Richard P. Feynman, Robert B. Leighton. *Feynman Lectures On Physics: The Complete And Definitive Issue.*, volume 3. Addison Wesley Publishing Company., http://www.aw-bc.com, 2nd edition, 1964.
[42] A. David Wunsch. *Complex Variables with Applications*. Addison-Wesley Publishing Company Inc., http://www.aw-bc.com/, 1983.

SUMMARY OF THE INVENTION

It's a first object is to provide a new PNDR and PPNDR capacitors which can offer faster and wider frequency responses.

It's a second object to provide an improved field-effect transistors (FETs) for offering better frequency response capability and sensitivity.

It's a third object to provide a memory assembly by introducing the dampering device, the PNDR or PPNDR capacitor and PNDR or PPNDR field-effect transistors (FETs) into the memory assembly to speed the access to the memory assembly.

It's a fourth object to provide the high-speed memory assembly advantaging their physical addressing capability with CPU so that the CPU can access to the memory assembly faster and efficiency.

It's a fifth object to provide the high-speed memory assembly stored with operating system so that CPU can speed the booting when system starts.

It's a sixth object is to provide the memory assembly of which a capacitor is discharged through an erasing circuit instead of neutralizing the capacitor by electrical shorting.

DETAILED DESCRIPTION

Figure 1:
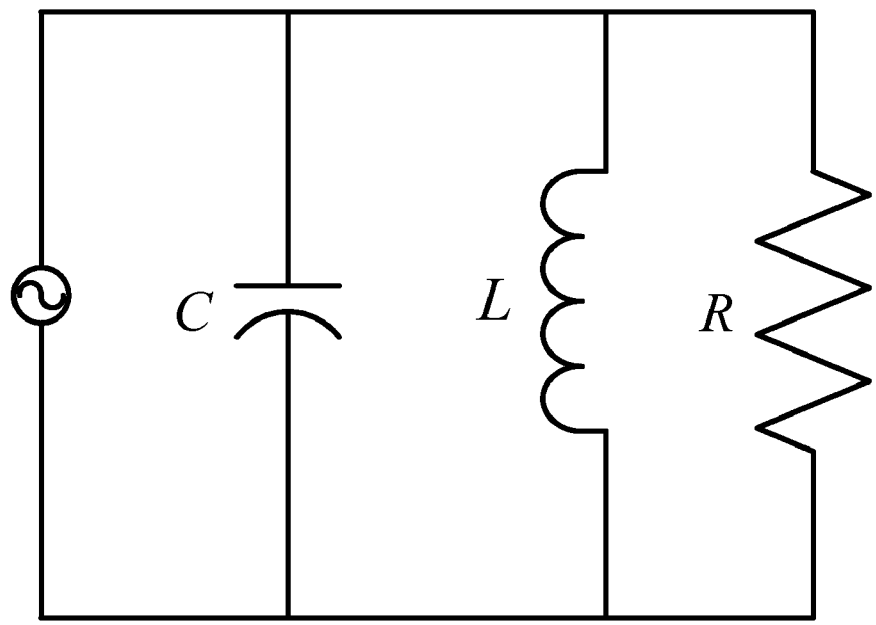
FIG. 1 has shown a parallel oscillator.
Figure 2:
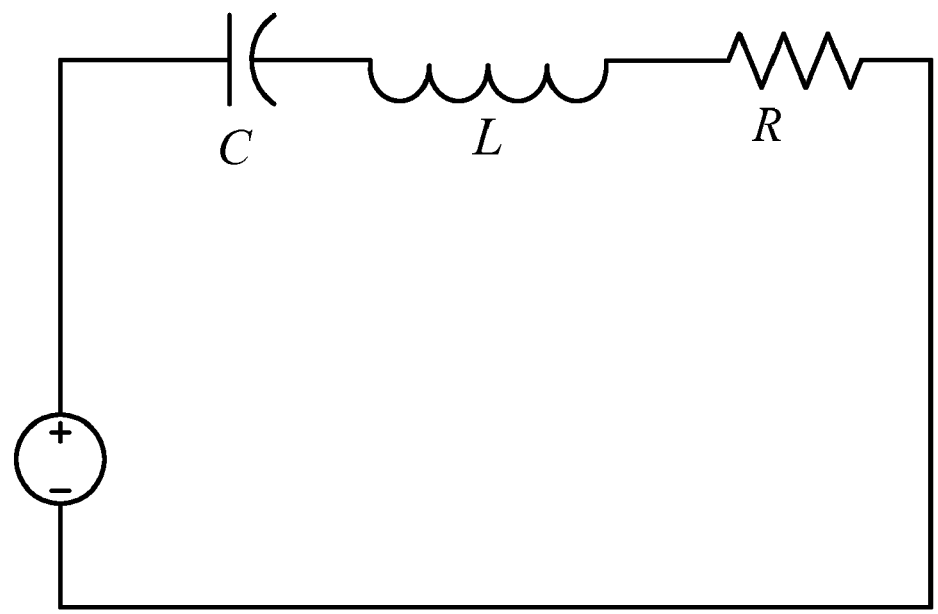
FIG. 2 has shown a serial oscillator.
Figure 3:
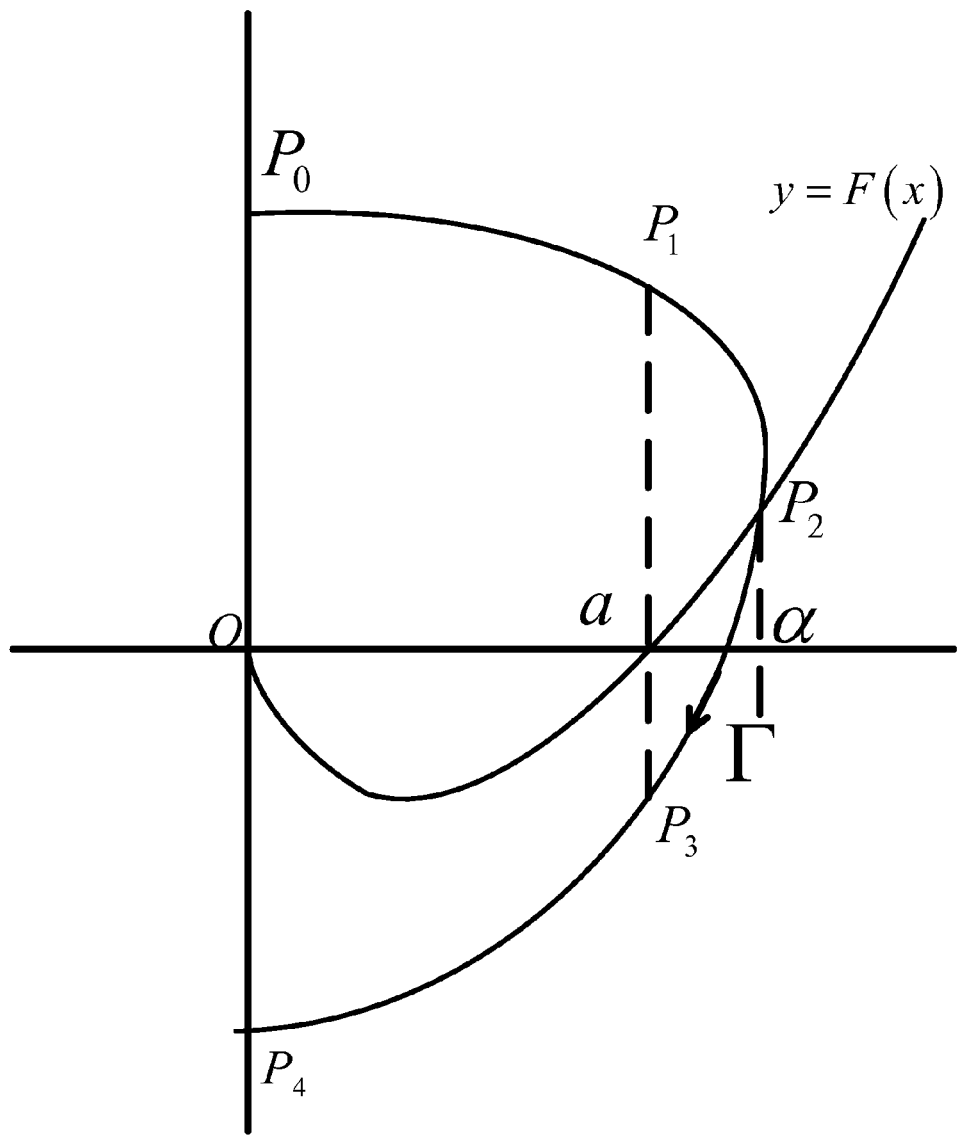
FIG. 3 has shown the function F(x) and a trajectory Γ of Liènard system.
Figure 4:
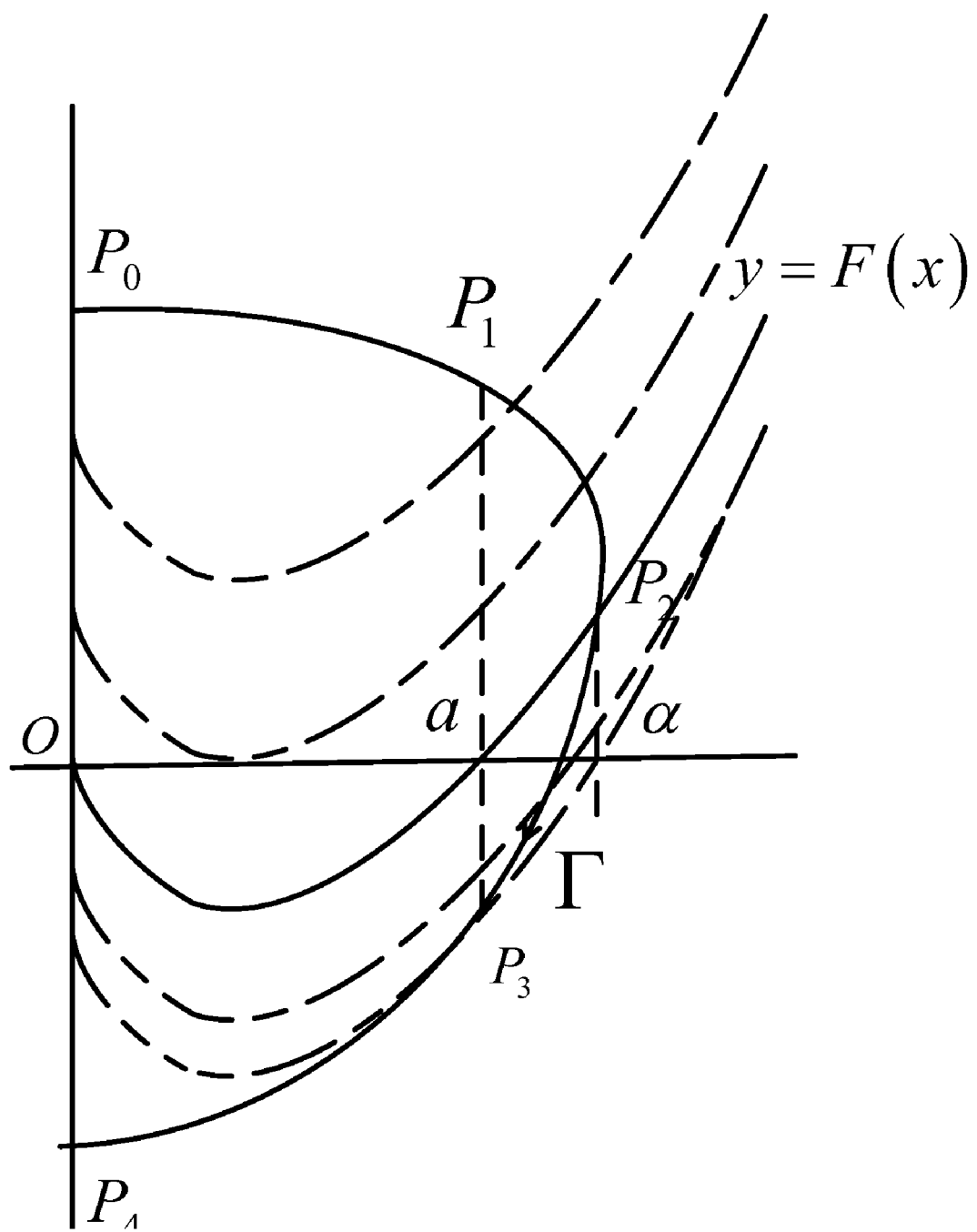
FIG. 4 has shown the impedance function F(x) is independent of the initial condition setting.
Figure 5:
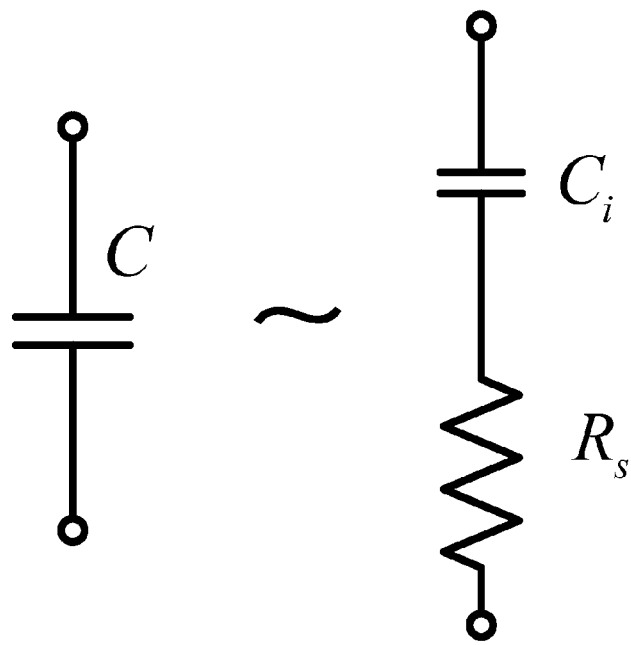
FIG. 5 a capacitor C decomposed into an ideal capacitor $C_i$, a series parasitic resistor $R_s$.

The impedance of a closed circuit has been discussed in the analytic continuation of the background information section. For any close loop the impedance function can be written in the complex form having real and imaginary parts shown as the equation (11), and the following three equations (17), (18) and (21) hold simultaneously. Equations (17), (18) and (21) are the intrinsic properties in any closed loop. Equations (17) and (18) are respectively defined as positive differential resistance (or PDR in short) and negative differential resistance (or NDR in short) in the present invention, and, equation (21) is defined as pure resistance. A device having PDR or NDR is respectively called PDR device or NDR device in the present invention. A device having pure resistance is called pure resistor in the present invention. Revealed in the "Positive and Negative Differential Resistances" in the background information section, the PDR and NDR devices can vary with temperature field T, magnetic field such as magnetic flux intensity B, optical field such as optical field intensity I, electric field such as voltage v, current i, frequency f, electrical power P, acoustic field, mechanical field such as magnitude of force F, vibration force or any combinations of them listed above. And, the pure resistor is irrelevant to temperature field T, magnetic field such as magnetic flux intensity B, optical field such as optical field intensity I, electric field such as voltage v, current i, frequency f, electrical power P, acoustic field, mechanical field such as magnitude of force F, or vibration force.

For any closed loop, obviously, the two equations (17) and (18) can be respectively carried out by a PDR device and a NDR device, and the two simultaneously held equations (17) and (18) can be carried out by a PDR device and a NDR device electrically connected in series.

Any closed loop without the PDR and NDR devices those intrinsic properties described by the (17) and (18) can not be realized, which means that the loop's dynamic behavior is much more suppressed, concealed and difficult to be observable. In other words, a loop's dynamic behavior will be much more significantly observable if the loop has the PDR and NDR devices.

The impedance function equation (11) expressed in spectrum domain is true for any closed loop and tells that the loop in nature includes unlimited harmonic, sub-harmonic, super-harmonic, intermediate harmonic components and combinations of them in a multi-band waveforms with very broad bandwidth. But without frequency responding device in the loop some or all of the waveform components may be concealed, suppressed or in insignificantly observable mode. A loop having at least a PDR device and a NDR device electrically connected in series can have significant, more observable and enlarged harmonic, sub-harmonic, super-harmonic and intermediate harmonic components which will modulate all together to generate more significantly observable multi-band waveforms with considerably broad bandwidth.

The mathematical equation (60) has been proved always true for any g(t) in 1902. The integral part of the equation can be the form or expression of electrical power if it is interpreted into electrical domain and tells that it includes amplitude, frequency and phase. By taking frequency limit operation on the equation its integral (or summation) is approaching to zero, which can be interpreted that the electrical power is dissipated if frequency shifted to higher enough. Please note that the result after summation of the equation (60) is not function of time, which means that the dissipation of electrical power is not done by a given time internal instead the dissipation of electrical power is done by frequency shifting at an instant time. It means that the dissipation of electrical power by frequency-shifting can be done in a very effective and quick way. The "electrical power" used in here is defined as (64) in term of current and voltage (i.e. the convolution of current and voltage). The "dissipation of electrical power" means that the electrical power in term of current and voltage can be transformed into another energy forms such as RF, magnetic field, optical field, heat, etc, or any combination of them. For example, if frequencies in and out of CPU respectively are around 20 kHz and 3 GHz so that a lot of the electrical power will be transformed into heat under this high frequency modulation, which explains why CPU needs a strong fan.

Revealed in the frequency-shift damping effect of the background information section, a PDR device and a NDR device electrically connected in series has frequency-shift damping effect which can perform higher-frequency shifting resulting in the dissipation of electrical power. And further, as earlier revelation, the PDR and NDR are field-interactable so that the dissipation of electrical power of a loop can be controlled by fields interactions listed above. This is a new method of the dissipation of electrical power of any closed loop by ultra-high frequency modulation revealed by the present invention.

The equation (1) is true for any capacitor of which dielectric has real and imaginary components, and according to the equation, for a specific dielectric material tan (δ), capacitance C of capacitor are dependent on resistance $R_s$ and excitating frequency ω. For constant resistance $R_s$ capacitance C is dependent on excitating frequency ω. For varying resistance $R_s$, capacitance C is dependent on varying resistance $R_s$ and varying excitating frequency ω.

The range of capacitance C of capacitor with varying $R_s$ will be broader than that with constant $R_s$.

For violently varying $R_s$ and exciting frequency ω the capacitor will have large-scale varying capacitance C as expected. If the PDR and NDR devices are implemented into a capacitor they can contribute the role of varying resistances and they will respond with very broad frequency responses to an exciting frequency ω to the capacitor resulting in a broad-band capacitances.

A capacitor which comprises a PDR device and a NDR device can also be called "PNDR capacitor" in the present invention.

Figure 7:
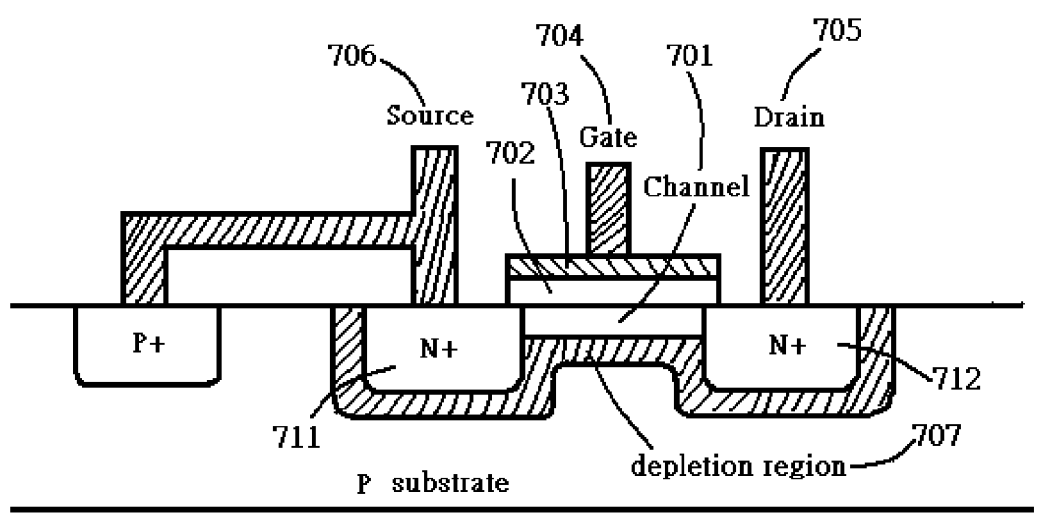
FIG. 7 has shown the structure of a typical MOSFET.
Figures 7A, 7B:
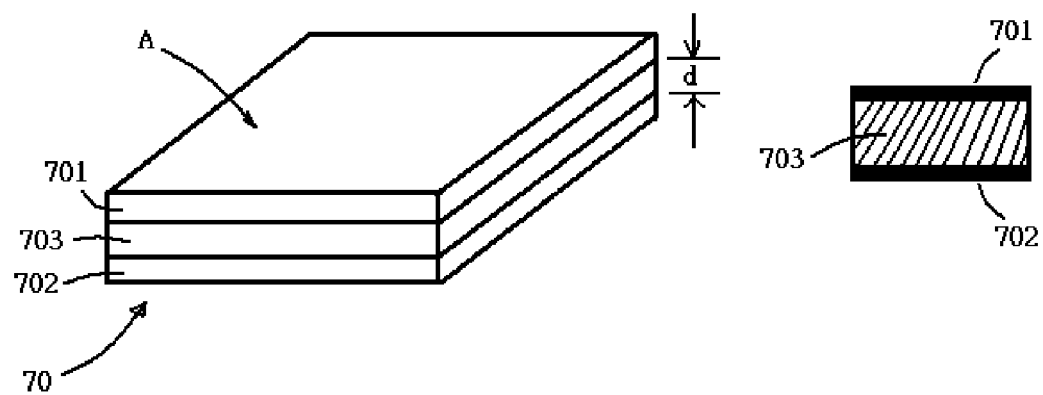
FIG. 7a has shown the structure of a typical capacitor.
FIG. 7b has shown the structure of a typical capacitor in cross view.
Figures 7C, 7D:
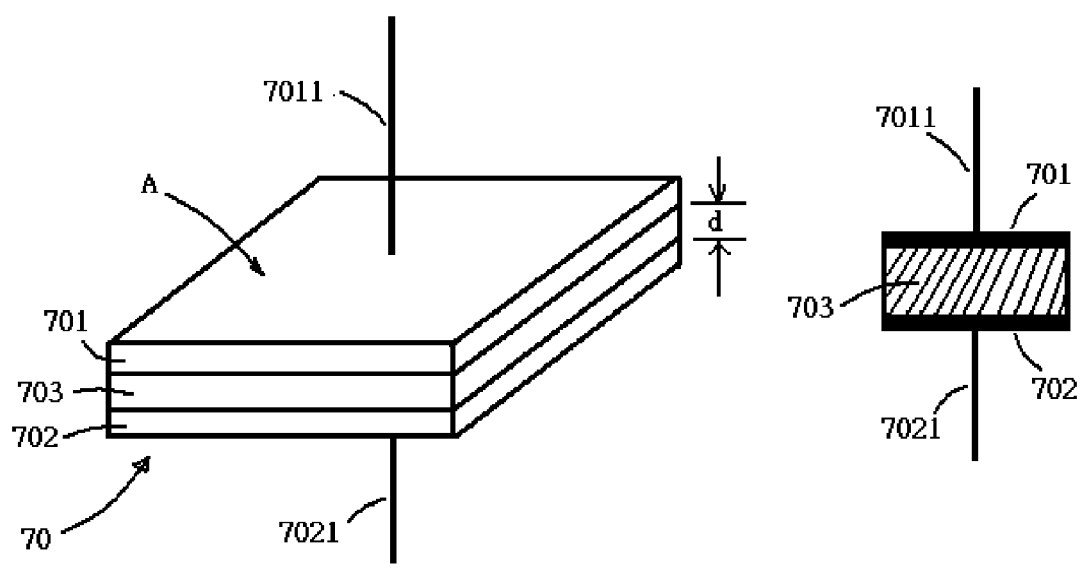
FIG. 7c has shown the capacitor of FIG. 7a with each of its two electrodes electrically connecting a terminal.
FIG. 7d has shown the capacitor of FIG. 7b with each of its two electrodes electrically connecting a terminal.

A typical capacitor consists of two conductive electrodes separated by a dielectric. A typical capacitor can be expressed in FIG. 7a by using parallel plate model or a typical capacitor in cross section can be simply expressed by FIG. 7b. A capacitor 70 consists of a first conductive electrode 701 and a second conductive electrode 702 separated by a dielectric 703. FIG. 7a has shown that the dielectric 703 is disposed between two conductive electrodes 701 and 702, each of area A and with a separation of d. The capacitor of FIG. 7a or 7b might need terminals respectively electrically connected with two conductive electrodes for electrically connecting with outside circuits. FIGS. 7c and 7d have shown that a first terminal 7011 and a second terminal 7021 are respectively electrically connected with the first conductive electrode 701 and the second conductive electrode 702 of the capacitor of FIG. 7a or 7b.

For the structure of the capacitor of FIG. 7a or 7b, a PNDR capacitor can be obtained if the first conductive electrode 701 and the second conductive electrode 702 comprises a PDR device and a NDR device. The combinations include the first conductive electrode 701 is a PDR device and the second conductive electrode 702 is a NDR device, or, the first conductive electrode 701 is a NDR device and the second conductive electrode 702 is a PDR device.

For the capacitor with terminals shown in FIG. 7c or 7d, a PNDR capacitor can be obtained if the first terminal 7011, the second terminals 7021, the first conductive electrode 701 and the second conductive electrodes 702 comprise a PDR device and at least a NDR device respectively located at two conductive electrode sides. The combinations include 16 possibilities excluding the first conductive electrode 701, the first terminal 7011, the second conductive electrode 702 and the second terminal 7021 are all PDR devices and NDR devices.

For example, the first conductive electrode 701, the first terminal 7011, the second conductive electrode 702 and the second terminal 7021 are respectively a PDR device, a PDR device, a NDR device and a NDR device so that at least a PDR device and a NDR device are located at two conductive electrode sides; the first conductive electrode 701, the first terminal 7011, the second conductive electrode 702 and the second terminal 7021 are respectively a PDR device, a NDR device, a NDR device and a NDR device so that at least a PDR device and a NDR device are located at two conductive electrode sides; the first conductive electrode 701, the first terminal 7011, the second conductive electrode 702 and the second terminal 7021 are respectively a PDR device, a NDR device, a NDR device and a PDR device so that at least a PDR device and a NDR device are located at two conductive electrode sides; or the first conductive electrode 701, the first terminal 7011, the second conductive electrode 702 and the second terminal 7021 are respectively a NDR device, a NDR device, a NDR device and a PDR device so that at least a PDR device and a NDR device are located at two conductive electrode sides, etc.

According to equation (21), a device with its impedance function irrelevant to ω can be called pure resistor in the invention and ω can be temperature field T, magnetic field such as magnetic flux intensity B, optical field such as optical field intensity I, electric field such as voltage v, current i, frequency f, electrical power P, acoustic field, mechanical field such as magnitude of force F, or vibration force.

The pure resistor can be a dielectric characterizing its resistance keeps constant under the fields listed above so that the pure resistor can be disposed between the two electrodes of the capacitor. The pure resistor can provide expective bandgap for the capacitor and the bandgap level depends on the pure resistor used. Another dielectric with variable resistance can also be disposed between the first and second electrodes of capacitor for compensating the pure resistor with constant resistance. The relative location of the pure resistor to the other dielectrics disposed between the two electrodes of a capacitor are not limited but may result in the different capacitances.

Figure 7E:
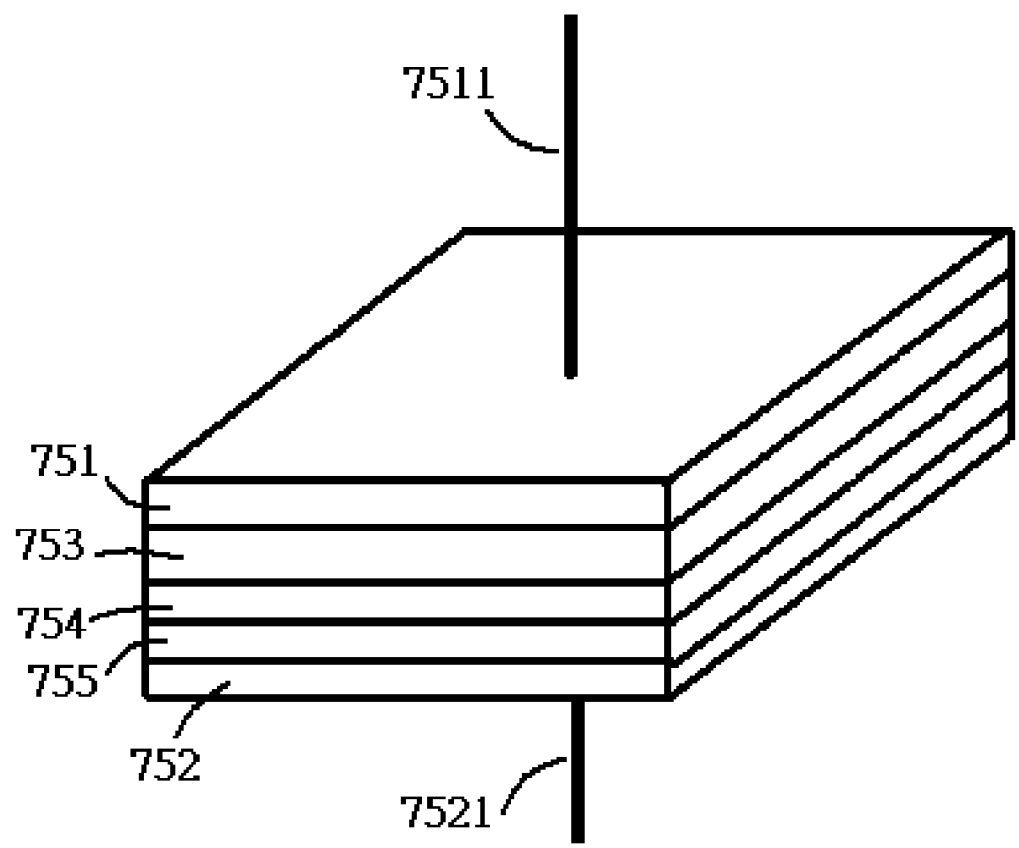
FIG. 7e has shown a dielectric assembly disposed between two electrodes and the dielectric assembly comprises a first dielectric, a second dielectric and a pure resistor disposed between the first and second dielectrics.

An embodiment, shown in FIG. 7e, which has shown a pure resistor 754 is sandwiched between a first dielectric 753 and a second dielectric 755, and the first dielectric 753 and the second dielectric 755 are respectively physically contacted with the first electrode 751 and the second electrode 752. FIG. 7e has also shown a first terminal 7511 and a second terminal 7521 are respectively electrically connected with the first electrode 751 and the second electrode 752 for electrically connecting with outside circuits. The pure resistor 754 is for providing an expective bandgap for the PNDR capacitor and the bandgap depends on the pure resistor used. The PNDR capacitor comprising a pure resistor disposed between its two electrodes is called PPNDR capacitor in the present invention.

The PDR and NDR devices are not limited. For example, the PDR and NDR devices respectively include the positive temperature coefficient resistor (or PTC in short), and negative temperature coefficient resistor (or NTC in short).

Figure 6A:
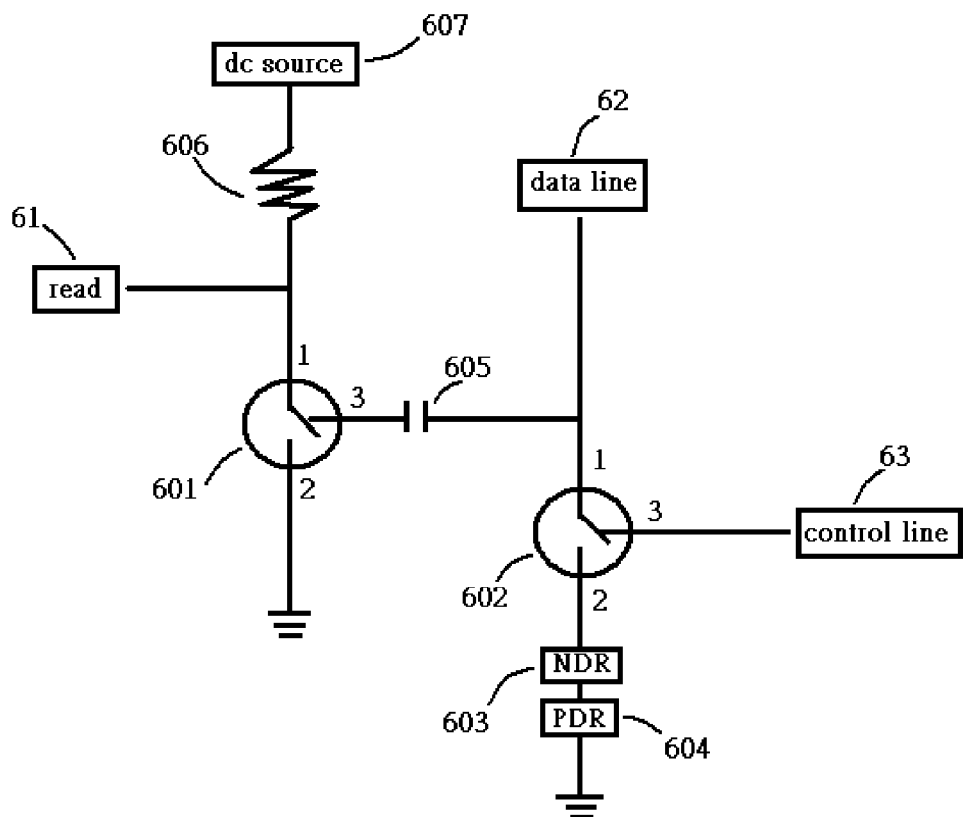
FIG. 6a has shown a memory assembly.

Shown in FIG. 6a, each of a first and second switches 601, 602 comprises a first, second and third terminals respectively marked by 1, 2 and 3, and the electrical connection or disconnection of the first and second terminals of each switch are controlled by a signal on the third terminal of the switch. For example, the electrical connection or disconnection of the first and second terminals of the first switch 601 are controlled by the status of a capacitor 605 electrically connected with the third terminal of the first switch. For example, the first switch 601 is on if the capacitor 605 is charged and the first switch 601 is off if the capacitor 605 is discharged, or the first switch 601 is on if the capacitor 605 is discharged and the first switch 601 is off if the capacitor 605 is charged.

The electrical connection or disconnection of the first and second terminals of each switch can be respectively described as in on or off state. For example, the first switch 601 is in on state means that its first and second terminals are electrically connected, and the first switch 601 is in off state means that its first and second terminals are electrically disconnected.

FIG. 6a has shown that a memory device comprises a capacitor 605, a capacitor status circuit and an erasing circuit. The status of the capacitor 605 is for controlling the "capacitor status circuit" which reflects the charged or discharged status of the capacitor 605. The charged capacitor 605 is discharged through the erasing circuit. The capacitor status circuit comprises a dc source 607, a resistor 606 and a first switch 601 electrically connected in series with each other, and the capacitor 605 electrically connects the third terminal of the first switch 601 for controlling the electrical connection or disconnection of the first and second terminals of the first switch 601. The capacitor 605 can be charged by a data-in through a data line 62. The charged or discharged status of the capacitor 605 can respectively control the electrical connection or disconnection, or electrical disconnection or connection of the first and second terminals of the first switch 601.

For example, an embodiment shown in FIG. 6a, the charged or discharged capacitor 605 turns on the first switch 601 and a "low" can be read at a location between the resistor 606 and the high side of the first switch 601. The discharged or charged capacitor 605 turns off the first switch 601 and a "high" is read at a location between the resistor 606 and the high side of the first switch 601. Another embodiment shown in FIG. 6d, the charged or discharged capacitor 605 turns on the first switch 601 and a "high" can be read at a location between the resistor 606 and the side of the first switch 601. The discharged or charged capacitor 605 turns off the first switch 601 and a "low" is read at a location between the resistor 606 and the low side of the first switch 601.

Different voltage readings on the capacitor status circuit reflects the status of the capacitor 605. The reading point on the capacitor status circuit is not limited, for example, the resistor 606 can be disposed at either side of the first switch 601 but the voltage reading points may be at different locations on the capacitor status circuit. The capacitor status circuit is not limited. The location of the resistor 606 in the capacitor status circuit is not limited. Voltage reading point on the capacitor status circuit is not limited. The capacitor 605 is charged by a data-in through a data line 62.

Figure 6B:
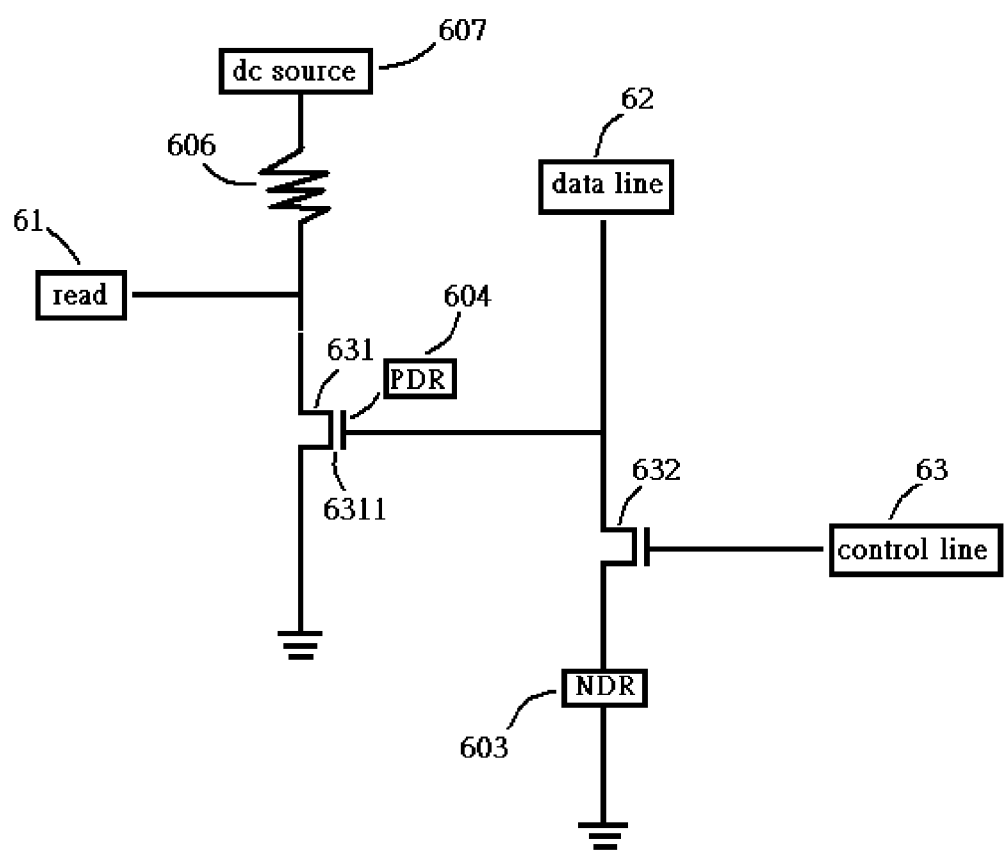
FIG. 6b has shown the memory assembly of FIG. 6a of which the first and second switches are respectively replaced by a first FET and a second FET and the capacitor is formed with the gate of the first FET and the gate functions as the PDR device.

An embodiment, the first switch 601 and the second switch 602 of FIG. 6a can use FETs (field-effect transistors) which advantage high frequency responses. FIG. 6b has shown the replacements of which a first FET 631 and a second FET 632 are seen.

FET has been known to us for very long time so that only a brief introduction is repeated here. The field-effect transistor (FET) relies on an electrical field to control the shape and hence the conductivity of a channel of one type of charge carrier in a semiconductor material.

All FETs have a body, an insulator or a dielectric, a drain, source and gate of which the drain and source are built in the body, and the FET controls the flow of electrons (or electron holes) from the source to drain by affecting the size and shape of a "conductive channel" created and influenced by voltage (or electrical field) applied across the gate. The gate may be thought of as controlling the opening and closing of a physical gate. This gate permits electrons (or electron holes) to flow through or blocks their passage by creating or eliminating a channel between the source and drain. The dielectric is disposed between the gate and the body so that the structure of the gate, dielectric and body can be viewed as a capacitor.

Figure 8A:
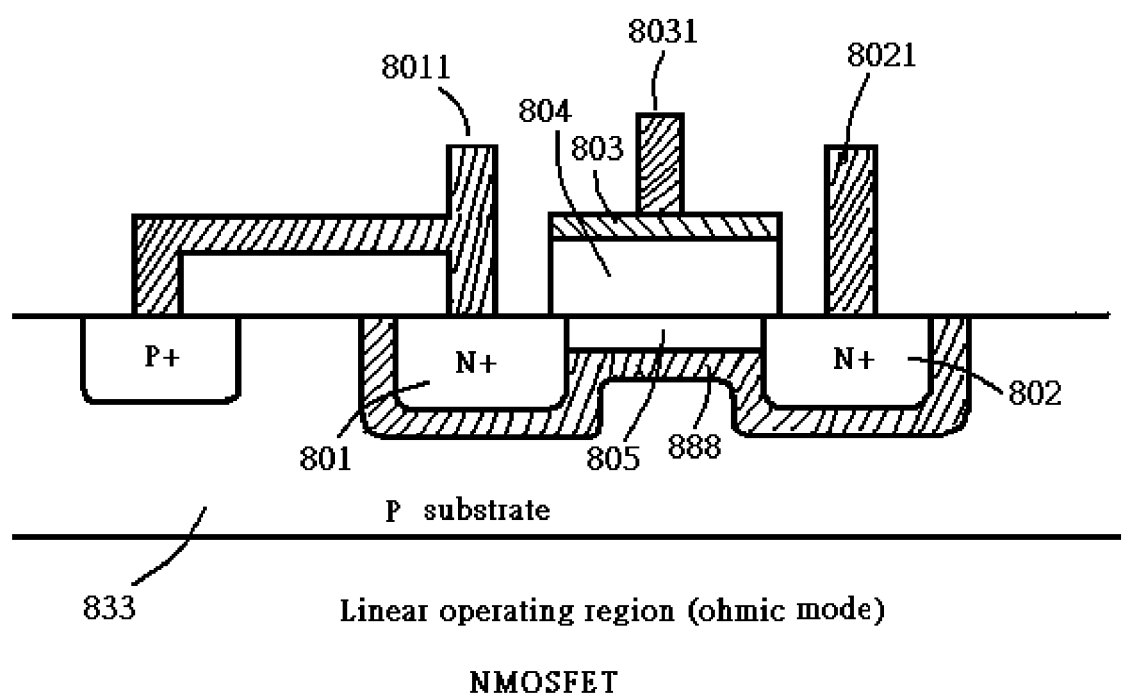
FIG. 8a has shown the structure of a PNDR NMOSFET of which a dielectric is disposed between the gate and the body.

One popular FET is MOSFET (metal-oxide-semiconductor field-effect transistor). FIG. 8a has used a NMOSFET in cross view to do the explanation. A source 801 and a drain 802 are two separated heavily dopped areas built in a body 833. A conductive channel 805 formed between the source 801 and drain 802 in the body 833 is influenced by an electrical field applied on a gate 803 insulated from the body 833 by an insulator or a dielectric 804. Please note that the structure of the gate 803, the body 833 and the dielectric 804 disposed between the gate 803 and the body 833 can be viewed as a capacitor. Each of the source 801, drain 802 and gate 803 are respectively electrically connected with a source terminal 8011, drain terminal 8021 and gate terminal 8031 for electrically connected with outside circuits.

The structures of the PNDR and PPNDR capacitors revealed above can be implemented into the capacitor formed with the gate of the MOSFET of FIG. 8a. A first case, the PNDR capacitor can be formed by the gate 803, dielectric 804 and body 833 of which the gate 803 and the body 833 are electrodes and the gate 803 and at least a portion of the body 833 physically contacting the dielectric 804 comprises a PDR device and a NDR device, or, a second case, the PNDR capacitor can be formed by the gate 803, dielectric 804 and a lamina electrode disposed between the dielectric 804 and the body 833 of which the gate 803 and the lamina electrode are electrodes and the gate 803 and the lamina electrode comprises a PDR device and a NDR device. The gate 803 and the body 833 comprising a PDR device and a NDR device means that either one of the gate 803 and the body 833 is the PDR device and the other one of the gate 803 and the body 833 is the NDR device. The gate 803 and the lamina electrode comprising a PDR device and a NDR device means that either one of the gate 803 and the lamina electrode is the PDR device and the other one of the gate 803 and the lamina electrode is the NDR device. The lamina electrode is used to avoid the material changing of the body. The term "lamina electrode" is used because it is lamina type and plays the role of an electrode of the capacitor formed with the gate.

FIG. 8a has shown the PNDR capacitor of the first case if the gate 803 and the body 833 comprises a PDR device and a NDR device. The combinations have 2 possibilities: (1) the gate 803 is a PDR device and the body 833 is a NDR device, or, (2) the gate 803 is a NDR device and the body 833 is a PDR device. If the gate terminal 8031 is taken into consideration, the gate terminal 8031, the gate 803 and the body 833 comprises a PDR device and a NDR device respectively located at different electrode sides. The combinations have 8 possibilities excluding the gate terminal 8031, the gate 803 and the body 833 are all PDR devices and NDR devices. Itemizing the combinations include the gate terminal 8031, the gate 803 and the body 833 can respectively be a PDR device, a PDR device and a NDR device; or the gate terminal 8031, the gate 803 and the body 833 can respectively be a PDR device, a NDR device and a NDR device; or the gate terminal 8031, the gate 803 and the body 833 can respectively be a NDR device, a PDR device and a NDR device; or the gate terminal 8031, the gate 803 and the body 833 can respectively be a NDR device, a NDR device and a PDR device; or the gate terminal 8031, the gate 803 and the body 833 can respectively be a NDR device, a PDR device and a PDR device; or the gate terminal 8031, the gate 803 and the body 833 can respectively be a PDR device, a NDR device and a PDR device. A case with that the gate terminal 8031, the gate 803 and the body 833 respectively are a PDR device, a PDR device and a PDR device, and a case with that the gate terminal 8031, the gate 803 and the body 833 respectively are a NDR device, a NDR device and a NDR device will be excluded.

Figure 8B:
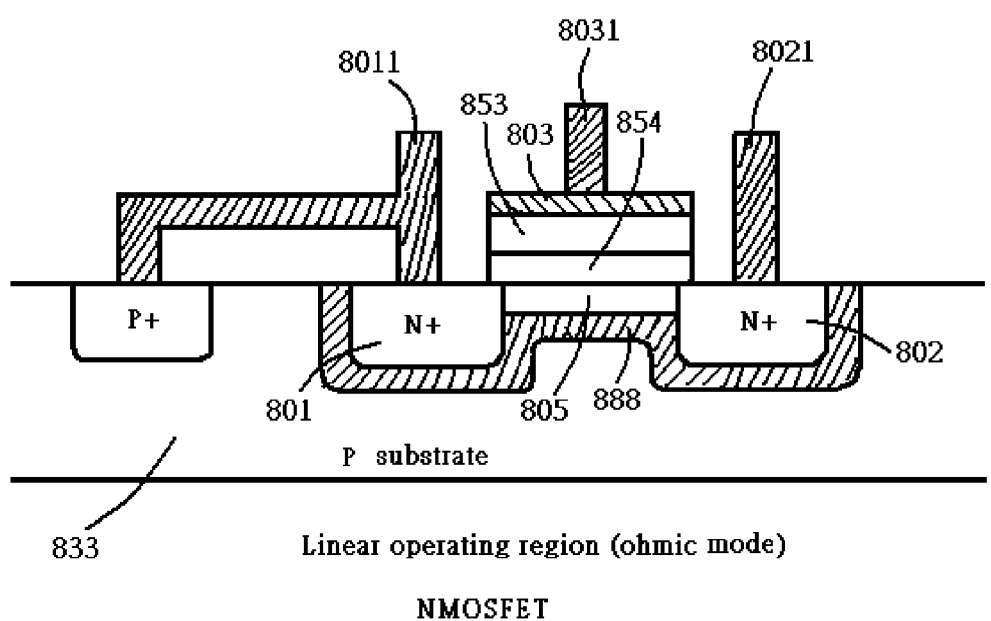
FIG. 8b has shown the structure of a PPNDR NMOSFET of which a dielectric and a pure resistor disposed between the gate and the body.
Figure 8C:
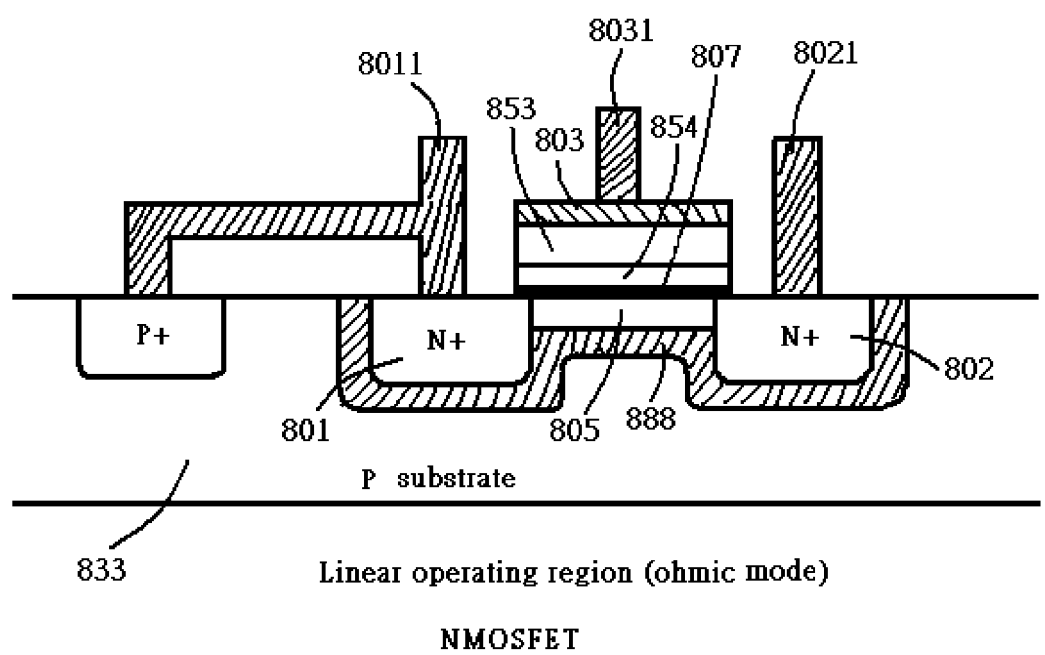
FIG. 8c has shown the structure of a PPNDR NMOSFET of which a dielectric and a pure resistor disposed between the gate and the lamina electrode.
Figure 8D:
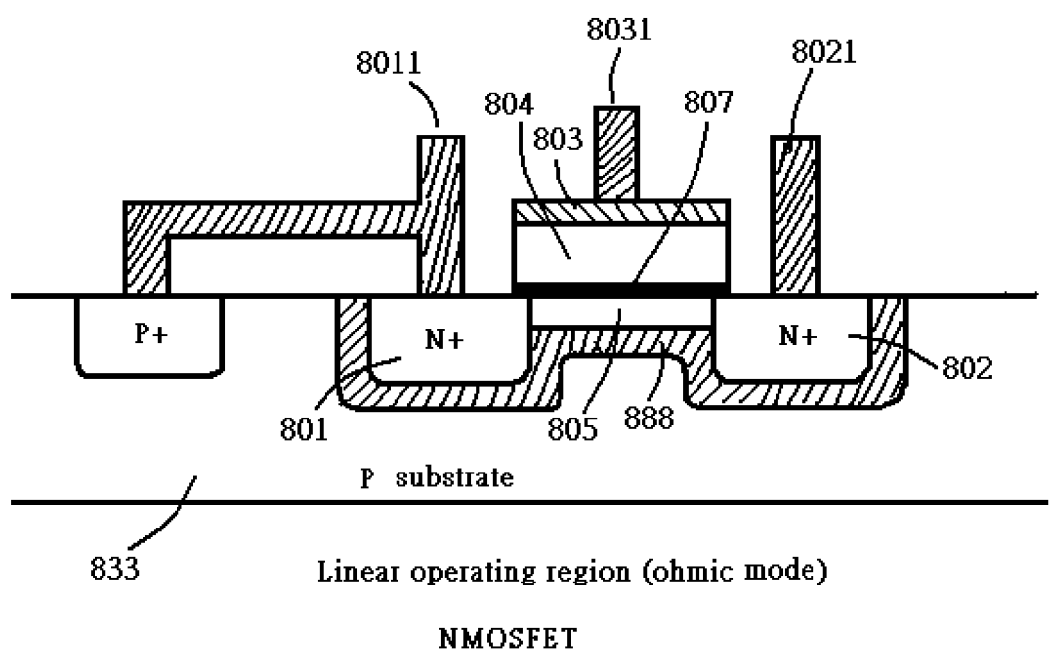
FIG. 8d has shown the structure of a PNDR NMOSFET of which a lamina electrode physically contacts with the body and a dielectric is disposed between the gate and the lamina electrode.

FIG. 8d has shown the PNDR capacitor of the second case if the gate 803 and a lamina electrode 807 comprises a PDR device and a NDR device. The lamina electrode 807 physically adjacent between the dielectric 804 and the body 833 is seen in FIG. 8d. The gate 803 and the lamina electrode 807 comprises a PDR device and a NDR device. The combinations have 2 possibilities: (1) the gate 803 is a PDR device and the lamina 807 is a NDR device, or, (2) the gate 803 is a NDR device and the lamina 807 is a PDR device. If the gate terminal 8031 is taken into consideration, the gate terminal 8031, the gate 803 and the lamina electrode 807 comprises a PDR device and a NDR device. The combinations have 8 possibilities excluding the gate terminal 8031, the gate 803 and the lamina electrode 807 are all PDR devices or NDR devices.

A PPNDR capacitor can be obtained by comprising a pure resistor disposed between the two electrodes of the PNDR capacitors of FIGS. 8a and 8d. FIG. 8b has shown a pure resistor 854 and a dielectric 853 disposed between the gate 803 and the body 833. FIG. 8c has shown a pure resistor 854 and a dielectric 853 disposed between the gate 803 and the lamina dielectrode 807. The pure resistor can provide an expective bandgap for the capacitor.

Figure 8E:
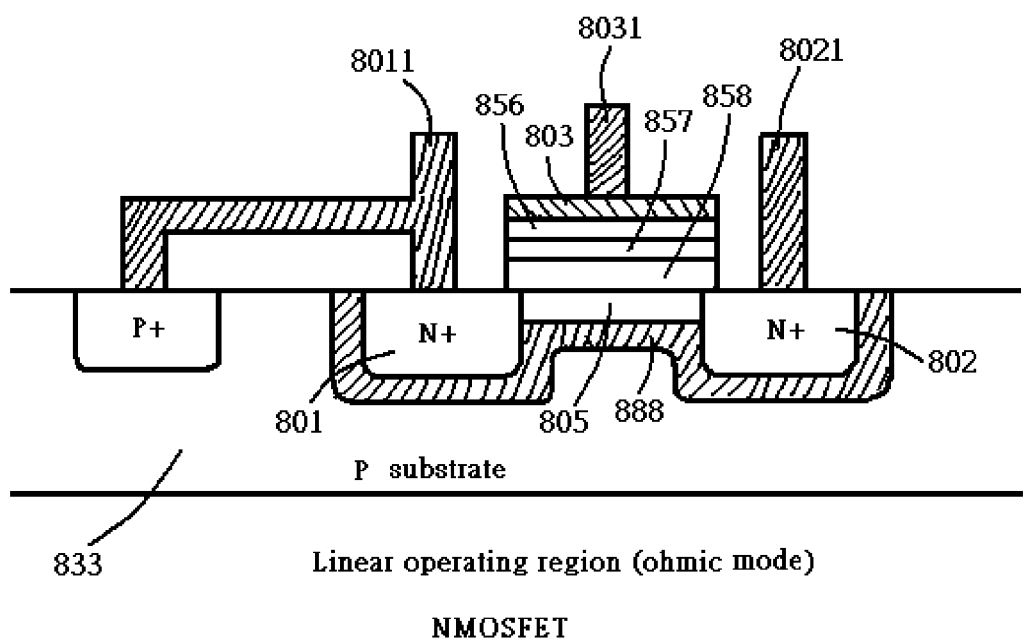
FIG. 8e has shown the structure of a PPNDR NMOSFET of which a dielectric assembly disposed between the gate and the body and the dielectric assembly comprises a first dielectric, a second dielectric and a pure resistor disposed between the first and second dielectrics.
Figure 8F:
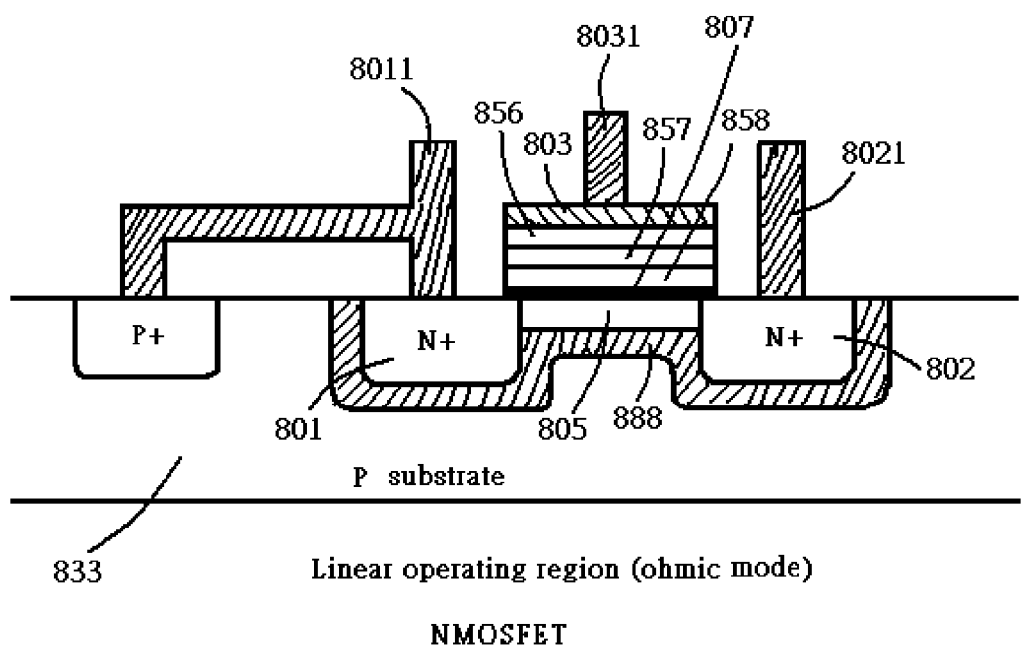
FIG. 8f has shown the structure of a PPNDR NMOSFET of which a lamina electrode physically contacts with the body and a dielectric assembly disposed between the gate and the lamina electrode and the dielectric assembly comprises a first dielectric, a second dielectric and a pure resistor disposed between the first and second dielectrics.

FIG. 8e has shown the capacitor of FIG. 8a except the dielectric 804 of FIG. 8a replaced by a dielectric assembly which comprises a first lamina 856, a second lamina 857 and a third lamina 858 of which the second lamina 857 is disposed between the first and third laminae 856, 858 and the first and third laminae 856, 858 are dielectrics and the second lamina 857 is a pure resistor same as revealed in the PPNDR capacitor of FIG. 7e above. FIG. 8f has shown the capacitor of FIG. 8d except the dielectric 804 of FIG. 8d replaced by a dielectric assembly which comprises a first lamina 856, a second lamina 857 and a third lamina 858 of which the second lamina 857 is disposed between the first and third laminae 856, 858 and the first and third laminae 856, 858 are dielectrics and the second lamina 857 is a pure resistor. The pure resistor can provide an expective bandgap for the capacitor and the bandgap level depends on the pure resistor used.

The FET respectively built with PNDR and PPNDR capacitors will be respectively called PNDR and PPNDR FETs in the invention. The PNDR and PPNDR FETs have very wide range of capacitances as well as wider frequency response as expected. And further, if the source, drain and gate terminals 8011, 8021 and 8031 of the PNDR and PPNDR FETs are PDR devices the energy in the FETs will more consume through those PDR terminals so that the source, drain and gate terminals 8011, 8021 and 8031 should adopt NDR devices to avoid such energy consumptions.

The FET is not limited, the PNDR FET is not limited and PPNDR FETs is not limited.

Now go back to the erasing circuit of FIG. 6a which comprises the capacitor 605 and a second switch 602 electrically connected in series, and the erasing circuit comprises a PDR device and a NDR device electrically connected in series, and the second switch 602 is controlled by a control signal through a control line 63. The possibilities include that both of the capacitor 605 and the second switch 602 are PDR devices so that at least a NDR device other than the capacitor 605 and the second switch 602 is needed and the NDR, the capacitor 605 and the second switch 602 are electrically connected in series with each other, or, both of the capacitor 605 and the second switch 602 are NDR devices so that at least a PDR device other than the capacitor 605 and the second switch 602 is needed and the PDR, the capacitor 605 and the second switch 602 are electrically connected in series with each other, or, any one of the capacitor 605 and the second switch 602 is a PDR device and the other one of the capacitor 605 and the second switch 602 is a NDR device, or at least a PDR device and at least a NDR device other than the capacitor 605 and the second switch 602, the capacitor 605 and the second switch 602 are electrically connected in series with each other.

FIG. 6a has shown a PDR device 604 and a NDR device 603 other than the capacitor 605 and the second switch 602 are added into the erasing circuit and the PDR device 604 and the NDR device 603, the capacitor 605 and the second switch 602 are electrically connected in series with each other. It's fact that PDR device can be seen almost everywhere but not the case for NDR device.

When the control signal through the control line 63 turns on the second switch 602 then the erasing circuit becomes a closed loop so that the charges of the capacitor 605 will be quickly discharged or erased through the erasing circuit unlike the modern flash memory using "electrical shorting" to erase the charges in the capacitor. Using "electrical shorting" to erase the charges in the capacitor will possibly cause material fatigue to the capacitor into reliability problem eventually. As explained earlier, revealed by the equation (60), the charges in the capacitor 605 will be quickly dissipated through the high frequency shifting by the PDR device 604 and NDR device 603 electrically connected in series.

The capacitor 605 can have volatile or non-volatile structure to hold the charges. The capacitor 605 having volatile structure can be called volatile capacitor and the capacitor 605 having non-volatile structure can be called non-volatile capacitor. The volatile capacitor needs refreshing at a certain period of time through the data line as a typical DRAM but the non-volatile capacitor can hold the charges in the condition with power removed as a FLASH memory. The first and second switches 601, 602 are not limited, for example, the first and second switch 601, 602 can be FETs. FIG. 6b has shown the FIG. 6a with the first FET 631 and the second FET 632 respectively replacing the first switch 601 and second switch 602. The capacitor 605 is not limited, for example, it can be a volatile or non-volatile capacitor, and it can be formed with the gate of FET as revealed above.

FIG. 6b has shown the memory device of FIG. 6a with the first switch 601 and second switch 602 respectively designated by the first FET 631 and the second FET 632 and the capacitor 6311 formed with the gate of the first FET 631 plays the role of the capacitor 605 of FIG. 6a. FIG. 6b has also shown the gate of the first FET functioning a PDR device which advantages fast charging to the capacitor formed with the gate of the first FET.

Figure 6C:
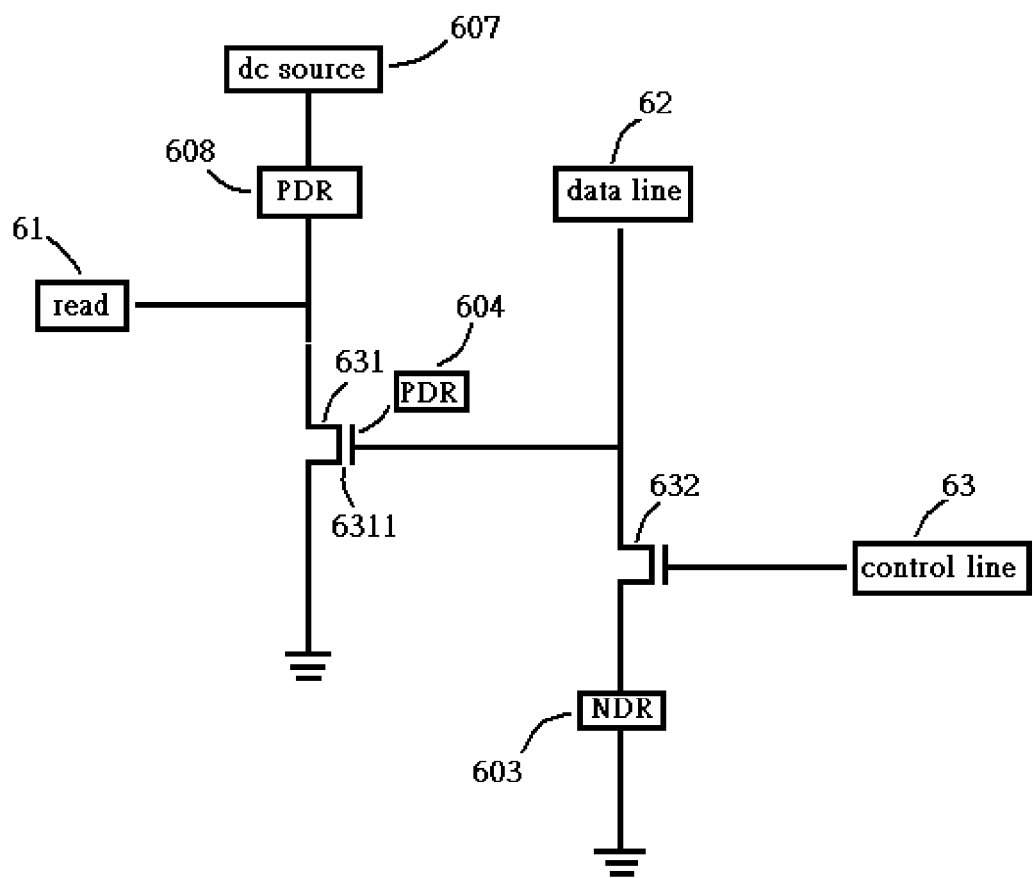
FIG. 6c has shown the memory assembly of FIG. 6b of which the resistor of the capacitor status circuit is a PDR device.
Figure 6D:
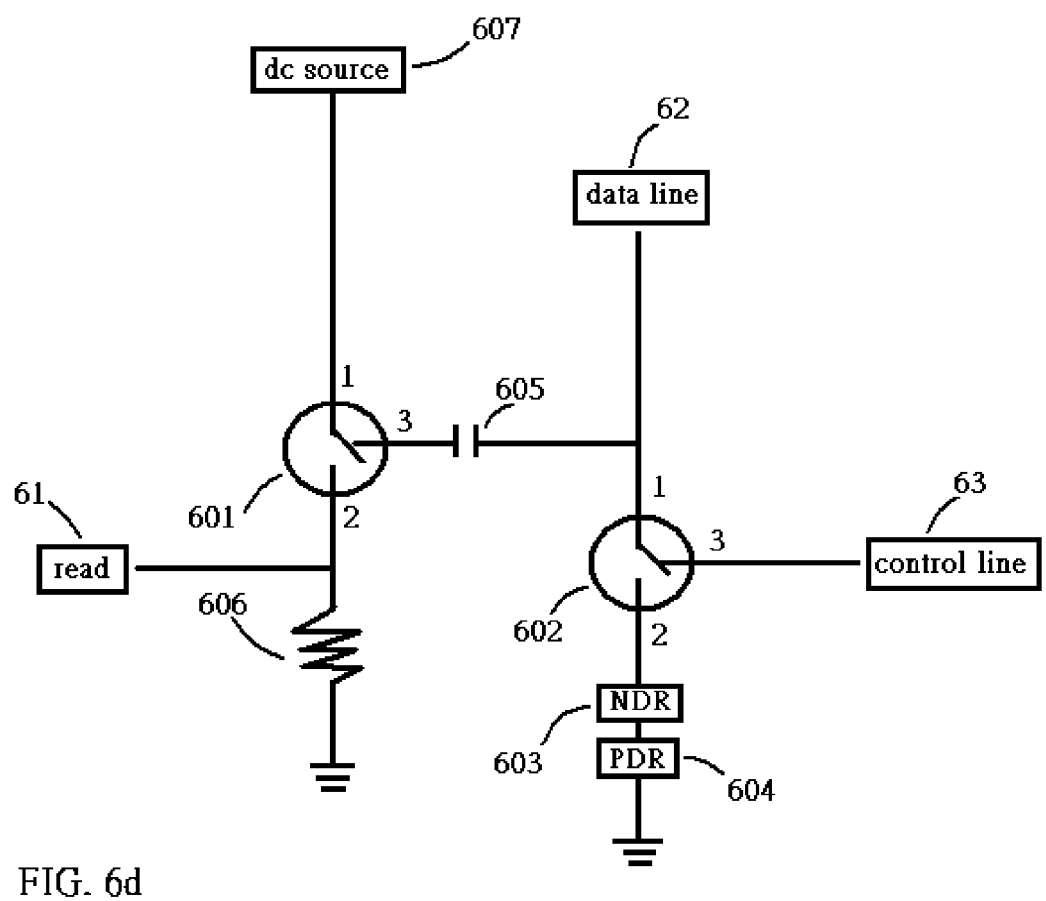
FIG. 6d has shown the memory assembly of FIG. 6b of which the resistor of the capacitor status circuit includes a NDR device and a PDR device electrically connected in series.

FIG. 6c has shown the capacitor status circuit of FIG. 6b with the resistor 606 replaced by a PDR device 608 to speed voltage reading on the capacitor status circuit for it is a frequency-responding device.

The memory devices revealed in the invention advantage their physical addressing capability so that the memory devices can physically address with CPU and execute programs so that operating system such as microsoft windows or/and Linux stored in the memory device can be quickly booted when system starts. The memory devices revealed in the invention advantage their very high frequency response and speed so that they have more chances to synchronize with CPU and can be embedded into CPU. The memory devices revealed in the invention can be a storage device to function as a hard disk.

The invention claimed is:

1. A memory assembly, comprising:
   a capacitor, wherein the capacitor is charged by a data-in, and the capacitor is a volatile or a non-volatile capacitor, and the non-volatile capacitor needs refreshing through the data-in;
   a capacitor status circuit controlled by the status of the capacitor for reflecting the status of the capacitor, wherein the capacitor status circuit comprises a dc source, a first switch and a resistor electrically connected in series with each other, and a read signal as a voltage level is read on the capacitor status circuit to reflect the status of the capacitor, and the on or off of the first switch is controlled by the status of the capacitor; and
   an erasing circuit for discharging the capacitor, wherein the erasing circuit comprises the capacitor and a second switch electrically connected in series, and the erasing circuit comprises a PDR device and a NDR device electrically connected in series, and the on or off of the second switch is controlled by a control signal.

2. The memory assembly of claim 1, wherein the first switch and second switch are respectively a first FET and a second FET, and the capacitor is formed with the gate of the first FET.

3. The memory assembly of claim 2, wherein each of the first and second FETs comprises a body, a source, a drain, a dielectric and a gate of which the source and drain are built in the body, and the dielectric is disposed between the gate and body, and the gate and body comprises a PDR device and a NDR device.

4. The memory assembly of claim 3, wherein the dielectric is a pure resistor.

5. The memory assembly of claim 3, wherein the resistor of the capacitor status circuit is a PDR device.

6. The memory assembly of claim 3, further comprising a CPU, wherein the control signal, data-in and read signal physically address with the CPU to speed the access to the memory assembly.

7. The memory assembly of claim 2, wherein each of the first and second FETs comprises a body, a source, a drain, a dielectric, a gate and a lamina electrode of which the source and drain are built in the body, and the dielectric and lamina electrode are disposed between the gate and the body, and the lamina electrode is physically contacted with the body, and the gate and lamina electrode comprises a PDR device and a NDR device.

8. The memory assembly of claim 7, wherein the dielectric is a pure resistor.

9. The memory assembly of claim 7, wherein the resistor of the capacitor status circuit is a PDR device.

* * * * *